(12) United States Patent
Wang et al.

(10) Patent No.: US 12,411,658 B2
(45) Date of Patent: Sep. 9, 2025

(54) MULTIPLIER, MULTIPLY-ACCUMULATE CIRCUIT, OPERATIONAL CIRCUIT, PROCESSOR, AND CALCULATION APPARATUS

(71) Applicant: SHENZHEN MICROBT ELECTRONICS TECHNOLOGY CO., LTD., Guangdong (CN)

(72) Inventors: Danyang Wang, Guangdong (CN); Tianzhi Xue, Guangdong (CN); Yun Zhai, Guangdong (CN); Zhijun Fan, Guangdong (CN); Zuoxing Yang, Guangdong (CN)

(73) Assignee: SHENZHEN MICROBT ELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/851,656

(22) PCT Filed: Jun. 19, 2024

(86) PCT No.: PCT/CN2024/099978
§ 371 (c)(1),
(2) Date: Sep. 26, 2024

(87) PCT Pub. No.: WO2025/039701
PCT Pub. Date: Feb. 27, 2025

(65) Prior Publication Data
US 2025/0117186 A1      Apr. 10, 2025

(30) Foreign Application Priority Data

Aug. 22, 2023   (CN) .......................... 202311056807.2

(51) Int. Cl.
*G06F 7/53*          (2006.01)
*G06F 7/523*         (2006.01)
(Continued)

(52) U.S. Cl.
CPC ................ *G06F 7/53* (2013.01); *G06F 7/523* (2013.01); *G06F 7/5443* (2013.01); *H03K 19/20* (2013.01)

(58) Field of Classification Search
CPC .......... G06F 7/53; G06F 7/523; G06F 7/5443; G06F 7/575; G06F 17/153; G06F 17/16
See application file for complete search history.

(56) References Cited

U.S. PATENT DOCUMENTS 5,195,051 A  *  3/1993  Palaniswami ............. G06F 7/38
                                                      708/503
2004/0010536 A1*  1/2004  Moreno .................... G06F 7/53
                                                      708/625
(Continued)

FOREIGN PATENT DOCUMENTS

CN       101384991 A      3/2009
CN       102662624 A      9/2012
(Continued)

OTHER PUBLICATIONS

Feng Guang-bo, Booth Multiplier Based on Asynchronous NoC Mechanism with English Abstract.

*Primary Examiner* — Emily E Larocque
(74) *Attorney, Agent, or Firm* — Dickinson Wright PLLC

(57) ABSTRACT

The present disclosure relates to a multiplier, a multiply-accumulate circuit, an operational circuit, a processor, and a calculation apparatus. The operational circuit includes an input processing circuit and the multiply-accumulate circuit. The input processing circuit receives a first number and outputs the first number as a first multiplicator for feeding into the multiply accumulate circuit by negating a sign bit of the first number in a case in which the first number is a signed number, and directly outputs the first number as the first multiplicator for feeding into the multiply-accumulate circuit in a case in which the first number is an unsigned (Continued)

number. The input processing circuit further receives a previously known second number and directly outputs the second number as a second multiplicator for feeding into the multiply-accumulate circuit. The multiply-accumulate circuit includes a multiplication subcircuit and an accumulation subcircuit.

20 Claims, 23 Drawing Sheets

(51) Int. Cl.
  *G06F 7/544* (2006.01)
  *H03K 19/20* (2006.01)

(56) References Cited

U.S. PATENT DOCUMENTS

2008/0243976 A1 10/2008 Wiencke
2013/0282783 A1 10/2013 Li et al.
2022/0405559 A1 12/2022 Abdelaziz et al.

FOREIGN PATENT DOCUMENTS

| | | |
|---|---|---|
| CN | 106897046 A | 6/2017 |
| CN | 110515589 A | 11/2019 |
| CN | 110515590 A | 11/2019 |
| CN | 110647307 A | 1/2020 |
| CN | 112540743 A | 3/2021 |
| CN | 116205244 A | 6/2023 |
| CN | 116208244 A | 6/2023 |
| CN | 116257210 A | 6/2023 |
| CN | 116301714 A | 6/2023 |
| CN | 116360730 A | 6/2023 |
| CN | 116450217 A | 7/2023 |
| CN | 116774966 A | 9/2023 |
| JP | 2002342070 A | 11/2002 |

\* cited by examiner

MULTIPLIER, MULTIPLY-ACCUMULATE CIRCUIT, OPERATIONAL CIRCUIT, PROCESSOR, AND CALCULATION APPARATUS

CROSS-REFERENCE TO RELATED APPLICATIONS

The present application is a national stage of International Application No. PCT/CN2024/099978, filed on Jun. 19, 2024, which is based on and claims priority to Chinese application No. 202311056807.2, filed on Aug. 22, 2023. Both of the aforementioned applications are herein incorporated by reference in their entirety.

TECHNICAL FIELD

The present disclosure relates to the technical field of data processing, and more particularly, to a multiplier, a multiply-accumulate circuit, an operational circuit, and a processor and a calculation apparatus that include the multiplier, or the multiply-accumulate circuit, or the operational circuit.

BACKGROUND

The multiply-accumulate (Multiply and Accumulate, MAC) circuit is used to complete the multiply-accumulate operation such as the multiplication of vectors, the multiplication of matrixes, the mutual multiplication of a vector and a matrix, and the like, and the MAC circuit is an extremely important operation subsystem in a processor such as a coprocessor, a digital signal processor, a central processor, a dedicated instruction processor, a neural network processor, and the like. In particular, rapid development of artificial intelligence highlights an important role of the neural network processor, so that the neural network processor gradually becomes a cornerstone of the intelligent computing technology. A convolution calculation unit is a core unit of the neural network processor, and implementation of the convolution calculation unit is inseparable from the multiply-accumulate operation performed by the multiply-accumulate circuit on activated data and weight data. Therefore, design of the multiply-accumulate circuit is of vital importance to the convolution calculation unit and the neural network processor.

SUMMARY

According to a first aspect of the present disclosure, a multiplier is provided, the multiplier is configured to perform a multiplication operation of a first multiplicator and a second multiplicator, wherein the first multiplicator is an unsigned number, the second multiplicator is a previously known unsigned or signed number, and the multiplier comprises:
  a partial product generation circuit, configured to receive the first multiplicator and the second multiplicator and to output a partial product thereof; and
  a partial product summing circuit, wherein an input terminal of the partial product summing circuit is coupled to an output terminal of the partial product generation circuit, and the partial product summing circuit is configured to receive and to sum the partial product output by the partial product generation circuit;
  wherein the partial product generation circuit comprises a first partial product generation unit for outputting a partial product of a highest bit of the second multiplicator and the first multiplicator, and the first partial product generation unit is configured to:
    in a case in which the second multiplicator is the unsigned number, output the partial product of the highest bit of the second multiplicator and the first multiplicator; and
    in a case in which the second multiplicator is the signed number, output a negation result of the partial product of the highest bit of the second multiplicator and the first multiplicator.

In some embodiments, the first partial product generation unit is configured to:
  receive a sign flag bit indicating whether the second multiplicator is the unsigned or signed number;
  in a case in which the sign flag bit indicates that the second multiplicator is the unsigned number, output the partial product of the highest bit of the second multiplicator and the first multiplicator; and
  in a case in which the sign flag bit indicates that the second multiplicator is the signed number, output the negation result of the partial product of the highest bit of the second multiplicator and the first multiplicator.

In some embodiments, the first partial product generation unit comprises:
  an AND gate group, configured to receive the highest bit of the second multiplicator and the first multiplicator, and to perform an AND operation thereon; and
  an exclusive-OR gate group, configured to receive an AND operation result of the AND gate group and the sign flag bit, and to perform an exclusive-OR operation thereon,
  wherein an exclusive-OR operation result of the exclusive-OR gate group is provided as an output of the first partial product generation unit.

In some embodiments, the first partial product generation unit comprises:
  a NAND gate group, configured to receive the highest bit of the second multiplicator and the first multiplicator, and to perform a NAND operation thereon; and
  an exclusive-OR gate group, configured to receive a NAND operation result of the NAND gate group and the sign flag bit, and to perform an exclusive-OR operation thereon,
  wherein an exclusive-OR operation result of the exclusive-OR gate group is provided as an output of the first partial product generation unit.

In some embodiments, the first partial product generation unit comprises:
  an exclusive-OR gate, configured to receive the highest bit of the second multiplicator and the sign flag bit, and to perform an exclusive-OR operation thereon; and
  a multiplexer group, wherein each multiplexer in the multiplexer group is configured to receive the sign flag bit as a first input, to receive an exclusive-OR operation result of the exclusive-OR gate as a second input, to receive a corresponding bit of the first multiplicator as a selection signal, and to output the first input or the second input according to the selection signal,
  wherein an output of the multiplexer group is provided as an output of the first partial product generation unit.

In some embodiments, the first partial product generation unit comprises:
  an exclusive-OR gate, configured to receive the highest bit of the second multiplicator and the sign flag bit, and to perform an exclusive-OR operation thereon; and
  an inverse multiplexer group, wherein each inverse multiplexer in the inverse multiplexer group is configured to receive the sign flag bit as a first input, to receive an exclusive-OR operation result of the exclusive-OR gate as a second input, to receive a corresponding bit of the first multiplicator as a selection signal, and to output the first input or the second input according to the selection signal, wherein an output of the inverse multiplexer group is provided as an output of the first partial product generation unit.

In some embodiments, the first partial product generation unit comprises:

an AND gate group, configured to receive the highest bit of the second multiplicator and the first multiplicator, and to perform an AND operation thereon; and a multiplexer group, configured to receive an AND operation result of the AND gate group as a first input, to receive a negation result of the AND operation result of the AND gate group as a second input, to receive the sign flag bit as a selection signal, and to output the first input or the second input according to the selection signal, wherein an output of the multiplexer group is provided as an output of the first partial product generation unit.

In some embodiments, the partial product generation circuit further comprises a second partial product generation unit for outputting a partial product of a modified second multiplicator and the first multiplicator, wherein the modified second multiplicator is obtained by removing the highest bit of the second multiplicator and is an unsigned number, and the second partial product generation unit comprises a multiplier for performing a multiplication operation of an unsigned number and an unsigned number.

In some embodiments, the partial product generation circuit further comprises a plurality of second partial product generation units, and each of the plurality of second partial product generation units is configured to output a partial product of a corresponding bit of the second multiplicator other than the highest bit and the first multiplicator.

In some embodiments, each of the plurality of second partial product generation units comprises one of:

an AND gate group, configured to receive the corresponding bit of the second multiplicator other than the highest bit and the first multiplicator, and to perform an AND operation thereon, wherein an AND operation result of the AND gate group is provided as an output of the second partial product generation unit; or a NAND gate group, configured to receive the corresponding bit of the second multiplicator other than the highest bit and the first multiplicator, and to perform a NAND operation thereon, wherein a NAND operation result of the NAND gate group is provided as the output of the second partial product generation unit.

In some embodiments, an output terminal of the partial product summing circuit is coupled to an input terminal of an additional adding circuit, and the additional adding circuit is configured to add an output of the partial product summing circuit to a constant in a case in which the second multiplicator is the signed number, wherein the constant is $(1-2^z) \cdot 2^{w-1}$, z is a bit width of the first multiplicator, and w is a bit width of the second multiplicator.

According to a second aspect of the present disclosure, a multiply-accumulate circuit is provided, the multiply-accumulate circuit is configured to perform a multiply-accumulate operation of a plurality of pairs of first numbers and second numbers, wherein the second numbers are previously known, the multiply-accumulate circuit comprises at least one multiply-accumulate unit, and the multiply-accumulate unit comprises:

a multiplication subcircuit comprising a multiplier for performing a multiplication operation of a first multiplicator and a second multiplicator, wherein the first multiplicator is obtained from the first number and is an unsigned number, the second multiplicator is obtained from the second number and is a previously known unsigned or signed number, and the multiplier is configured to provide an output as an unsigned number; and an accumulation subcircuit, wherein an input terminal of the accumulation subcircuit is coupled to an output terminal of the multiplication subcircuit, and the accumulation subcircuit is configured to receive and to accumulate an output of the multiplication subcircuit.

In some embodiments, the multiplier of the multiplication subcircuit is the multiplier according to the first aspect of the present disclosure.

In some embodiments, the multiplication subcircuit comprises a plurality of multipliers, and each multiplier is configured to receive a corresponding pair of first multiplicator and second multiplicator and to obtain a product of the corresponding pair of first multiplicator and second multiplicator.

In some embodiments, the accumulation subcircuit comprises one of:

n stages of compression trees, a first adder, a second adder, and a register group, wherein an output terminal of the multiplication subcircuit is coupled to a corresponding input terminal of a first-stage of compression tree in the n stages of compression trees, an output terminal of an $i^{th}$-stage of compression tree in the n stages of compression trees is coupled to a corresponding input terminal of an $(i+1)^{th}$-stage of compression tree in the n stages of compression trees, an output terminal of an $n^{th}$-stage of compression tree in the n stages of compression trees is coupled to a corresponding input terminal of the first adder, an output terminal of the first adder is coupled to a corresponding input terminal of the second adder, an output terminal of the second adder is coupled to an input terminal of the register group, and an output terminal of the register group is coupled to a corresponding input terminal of the second adder, wherein n is a positive integer, and i=1, 2, . . . , n−1; or n stages of compression trees, a full adder, an adder, and a register group, wherein an output terminal of the multiplication subcircuit is coupled to a corresponding input terminal of a first-stage of compression tree in the n stages of compression trees, an output terminal of an $i^{th}$-stage of compression tree in the n stages of compression trees is coupled to a corresponding input terminal of an $(i+1)^{th}$-stage of compression tree in the n stages of compression trees, an output terminal of an $n^{th}$-stage of compression tree in the n stages of compression trees is coupled to a corresponding input terminal of the full adder, an output terminal of the full adder is coupled to a corresponding input terminal of the adder, an output terminal of the adder is coupled to an input terminal of the register group, and an output terminal of the register group is coupled to a corresponding input terminal of the full adder, wherein n is a positive integer, and i=1, 2, . . . , n−1; or n stages of compression trees, an adder, and a register group, wherein an output terminal of the multiplication subcircuit is coupled to a corresponding input terminal of a first-stage of compression tree in the n stages of compression trees, an output terminal of an $i^{th}$-stage of compression tree in the n stages of compression trees is coupled to a corresponding input terminal of an $(i+1)^{th}$-stage of compression tree in the n stages of compression trees, an output terminal of an $n^{th}$-stage of compression tree in the n stages of compression trees is coupled to a corresponding input terminal of the adder, an output terminal of the adder is coupled to an input terminal of the register group, an output terminal of the register group is coupled to a corresponding input terminal of the first-stage of compression tree in the n stages of compression trees, wherein n is a positive integer, and i=1, 2, ..., n−1; or a full adder module with one or more stages of full adders, an adder, and a register group, wherein an output terminal of the multiplication subcircuit is coupled to a corresponding input terminal of the full adder module, an output terminal of the full adder module is coupled to a corresponding input terminal of the adder, an output terminal of the adder is coupled to an input terminal of the register group, and an output terminal of the register group is coupled to a corresponding input terminal of the full adder module.

In some embodiments, the at least one multiply-accumulate unit comprises two or more multiply-accumulate units, the multiply-accumulate circuit further comprises a summing unit, input terminals of the summing unit are coupled to output terminals of the two or more multiply-accumulate units, and the summing unit is configured to receive and to sum outputs of the two or more multiply-accumulate units.

In some embodiments, the summing unit comprises s stages of compression trees and an adder, an output terminal of each of the two or more multiply-accumulate units is coupled to a corresponding input terminal of a first-stage of compression tree in the s stages of compression trees, an output terminal of an $i^{th}$-stage of compression tree in the s stages of compression trees is coupled to a corresponding input terminal of an $(i+1)^{th}$-stage of compression tree in the s stages of compression trees, and an output terminal of an $s^{th}$-stage of compression tree in the s stages of compression trees is coupled to a corresponding input terminal of the adder, wherein s is a non-negative integer, and i=1, 2, ..., s−1.

In some embodiments, the summing unit further comprises an additional register group, an input terminal of the additional register group is coupled to an output terminal of the adder, and an output terminal of the additional register group is coupled to a corresponding input terminal of the first-stage of compression tree in the s stages of compression trees.

In some embodiments, the multiply-accumulate circuit further comprises a control element disposed between an output terminal of each of the two or more multiply-accumulate units and a corresponding input terminal of the summing unit, the control element is configured to receive a control signal and an output of a corresponding multiply-accumulate unit, and to control, according to the control signal, whether to provide an output of the corresponding multiply-accumulate unit to the summing unit at an output terminal of the control element.

In some embodiments, an input terminal of the multiplication subcircuit is further coupled to an output terminal of an input processing circuit, and the input processing circuit is configured to receive the first number and the second number, and to;

in a case in which the first number is a signed number, output the first number as the first multiplicator for feeding into the multiplier by negating a sign bit of the first number, and output the second number as the second multiplicator for feeding into the multiplier; and in a case in which the first number is an unsigned number, output the first number as the first multiplicator for feeding into the multiplier, and output the second number as the second multiplicator for feeding into the multiplier.

In some embodiments, the input processing circuit comprises one of:

an exclusive-OR gate, configured to receive a highest bit of the first number and a sign flag bit indicating whether the first number is the unsigned number or the signed number, and to perform an exclusive-OR operation thereon, wherein an exclusive-OR operation result of the exclusive-OR gate is provided as the highest bit of the first number output by the input processing circuit; or a multiplexer, configured to receive a highest bit of the first number as a first input, to receive a negation result of the highest bit of the first number as a second input, to receive a sign flag bit indicating whether the first number is the unsigned number or the signed number as a selection signal, and to output the first input or the second input according to the selection signal, wherein an output of the multiplexer is provided as the highest bit of the first number output by the input processing circuit.

In some embodiments, an input terminal of the multiplication subcircuit is further coupled to an output terminal of an input processing circuit, the input processing circuit is configured to receive the first number and the second number, the input processing circuit is further configured to split the first number according to a bit width of the multiplier, and the multiply-accumulate circuit further comprises a shifter coupled to the output terminal of the multiplication subcircuit, and the shifter is configured to perform a shift operation corresponding to splitting.

In some embodiments, the input processing circuit is further configured to split the second number according to the bit width of the multiplier; or the input processing circuit is configured to receive the second number split in advance according to the bit width of the multiplier.

In some embodiments, an output terminal of the accumulation subcircuit is coupled to an input terminal of an output processing circuit, and the output processing circuit is configured to perform at least one of:

subtracting a first constant from an output of the accumulation subcircuit, wherein the first constant is a sum of second numbers after being shifted to left by (z−1) bits, the second numbers are all second numbers of the plurality of pairs of first numbers and second numbers that are paired with first numbers as signed numbers, wherein z is a bit width of the first number; or adding an output of the accumulation subcircuit and a second constant, wherein the second constant is $(1-2^z) \cdot 2^{w-1} \cdot y$, z is a bit width of the first multiplicator, w is a bit width of the second multiplicator, and y is a number of second multiplicators as signed numbers obtained from all second numbers of the plurality of pairs of first numbers and second numbers.

According to a third aspect of the present disclosure, an operational circuit is provided, comprising:

the multiply-accumulate circuit according to the second aspect of the present disclosure; and an input processing circuit, wherein an output terminal of the input processing circuit is coupled to an input terminal of the multiply-accumulate circuit, and the input processing circuit is configured to receive the first number and the second number, and to:

in a case in which the first number is a signed number, output the first number as the first multiplicator for feeding into the multiplier by negating a sign bit of the first number, and output the second number as the second multiplicator for feeding into the multiplier;

in a case in which the first number is an unsigned number, output the first number as the first multiplicator for feeding into the multiplier, and output the second number as the second multiplicator for feeding into the multiplier.

In some embodiments, the input processing circuit comprises one of:

an exclusive-OR gate, configured to receive a highest bit of the first number and a sign flag bit indicating whether the first number is the unsigned number or the signed number, and to perform an exclusive-OR operation thereon, wherein an exclusive-OR operation result of the exclusive-OR gate is provided as the highest bit of the first number output by the input processing circuit; or a multiplexer, configured to receive a highest bit of the first number as a first input, to receive a negation result of the highest bit of the first number as a second input, to receive a sign flag bit indicating whether the first number is the unsigned number or the signed number as a selection signal, and to output the first input or the second input according to the selection signal, wherein an output of the multiplexer is provided as the highest bit of the first number output by the input processing circuit.

In some embodiments, the input processing circuit is further configured to split the first number according to a bit width of the multiplier, and the multiply-accumulate circuit further comprises a shifter coupled to an output terminal of the multiplication subcircuit, and the shifter is configured to perform a shift operation corresponding to splitting.

In some embodiments, the input processing circuit is further configured to split the second number according to the bit width of the multiplier; or the input processing circuit is configured to receive the second number split in advance according to the bit width of the multiplier.

In some embodiments, the operational circuit further comprises:

an output processing circuit, wherein an output terminal of the multiply-accumulate circuit is coupled to an input terminal of the output processing circuit, and the output processing circuit is configured to perform at least one of:

subtracting a first constant from an output of the multiply-accumulate circuit, wherein the first constant is a sum of second numbers after being shifted to left by (z−1) bits, the second numbers are all second numbers of the plurality of pairs of first numbers and second numbers that are paired with first numbers as signed numbers, wherein z is a bit width of the first number; or adding an output of the multiply-accumulate circuit and a second constant, wherein the second constant is $(1-2^z) \cdot 2^{w-1} \cdot y$, z is a bit width of the first multiplicator, w is a bit width of the second multiplicator, and y is a number of second multiplicators as signed numbers obtained from all second numbers of the plurality of pairs of first numbers and second numbers.

According to a fourth aspect of the present disclosure, an operational circuit is provided, comprising:

the multiplier according to the first aspect of the present disclosure; and an additional adding circuit, wherein an output terminal of the multiplier is coupled to an input terminal of the additional adding circuit, and the additional adding circuit is configured to add an output of the partial product summing circuit and a constant in a case in which the second multiplicator is a signed number, wherein the constant is $(1-2^z) \cdot 2^{w-1}$, z is a bit width of the first multiplicator, and w is a bit width of the second multiplicator.

According to a fifth aspect of the present disclosure, a processor is provided, comprising the multiplier according to the first aspect of the present disclosure, or the multiply-accumulate circuit according to the second aspect of the present disclosure, or the operational circuit according to the third or the fourth aspect of the present disclosure.

According to a sixth aspect of the present disclosure, a calculation apparatus is provided, comprising the processor according to the fifth aspect of the present disclosure.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings that constitute a part of the specification depict embodiments of the present disclosure, and are used to explain the principle of the present disclosure together with the specification.

With reference to the accompanying drawings, the present disclosure can be understood more clearly according to the following detailed descriptions, wherein.

It is to be noted that in the embodiments illustrated below, sometimes the same reference signs are jointly used across different accompanying drawings to represent the same parts or parts with the same function, and repeated descriptions thereof are omitted. In the specification, similar numbers and letters are used to represent similar items. Therefore, once a certain item is defined in an accompanying drawing, it does not need to be further discussed in subsequent accompanying drawings.

For ease of understanding, locations, sizes, scopes, and the like of structures shown in the accompanying drawings or the like sometimes do not represent practical locations, sizes, scopes, and the like. Therefore, the disclosed invention is not limited to the locations, the sizes, the scopes, and the like disclosed in the accompanying drawings or the like. Moreover, the accompanying drawings are not necessarily drawn to scale, and some features may be enlarged to show details of specific components.

DETAILED DESCRIPTION

Various exemplary embodiments of the present disclosure are described in detail with reference to the accompanying drawings below. It is to be noted that, unless otherwise illustrated specifically, relative arrangement of components and steps, numerical expressions, and values stated in these embodiments do not limit the scope of the present disclosure.

Practically, the following descriptions of at least one exemplary embodiment are merely illustrative, and in no way constitute any limitation on the present disclosure and the application or use thereof. In other words, the structure and the method herein are shown in an exemplary manner to illustrate different embodiments of the structure and the method in the present disclosure. However, a person skilled in the art will understand that they merely illustrate exemplary rather than exhaustive manners in which the present disclosure may be implemented. Moreover, the accompanying drawings are not necessarily drawn to scale, and some features may be enlarged to show details of specific components.

In addition, a technology, a method, and a device known to a person of ordinary skill in the related art may not be discussed in detail, but in proper circumstances, said technology, method, and device shall be regarded as a part of the specification.

In all examples that are shown and discussed herein, any specific value should be interpreted only as an example but not as a limitation. Therefore, there may be different values in other examples of the exemplary embodiments.

Figure 1:
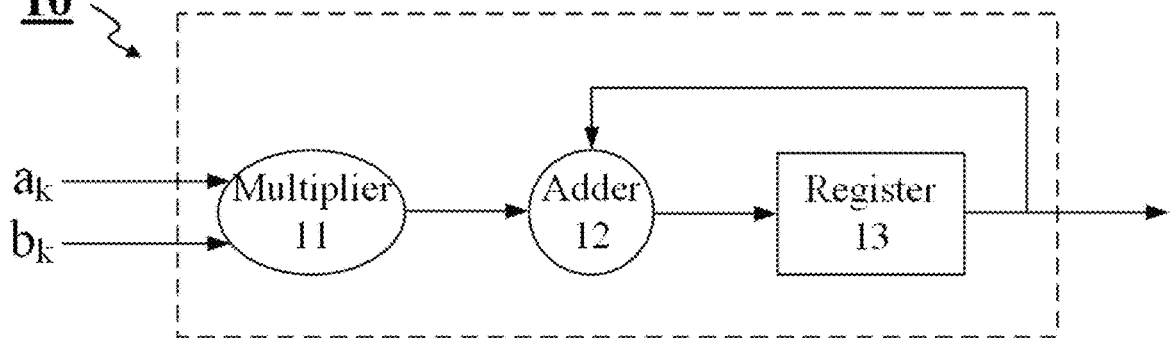
FIGS. 1 to 3 respectively show circuit diagrams of multiply-accumulate circuits according to some comparative examples of the present disclosure.

FIG. 1 shows a multiply-accumulate circuit 10 including a multiplier 11, an adder 12, and a register 13. It is assumed that the multiply-accumulate circuit 10 is to calculate the multiplication and accumulation of x pairs of numbers $(a_1 \cdot b_1 + a_2 \cdot b_2 + \ldots a_x \cdot b_x$, x is a positive integer), then in each of x periods, a corresponding pair of numbers $a_k$, $b_k$ (k=1, 2, ..., x) in the x pairs of numbers are fed into the multiplier 11 as the multiplicators to calculate a product $a_k \cdot b_k$ of this pair of numbers, and then $a_k \cdot b_k$ is accumulated via the adder 12 and the register 13. For example, if the x pairs of numbers are fed sequentially from 1 to x, then the result stored in the register 13 at the end of the first period is $a_1 \cdot b_1$, the result stored in the register 13 at the end of the second period is $a_1 \cdot b_1 + a_2 \cdot b_2$, until the result stored in the register 13 at the end of the xth period is $a_1 \cdot b_1 + a_2 \cdot b_2 + \ldots a_x \cdot b_x$.

However, the multiply-accumulate circuit 10 cannot be compatible with the multiply-accumulate operations of different data types including signed and unsigned numbers. For a signed number, its highest bit is used to represent the sign and may be referred to as the sign bit, the sign bit being 0 may represent a positive number, and the sign bit being 1 may represent a negative number. While for an unsigned number, its highest bit is only used to represent the value. For example, assuming that $a_k$=0b10101010 and $b_k$=0b01010101: if both $a_k$ and $b_k$ are signed numbers, then the decimal representation of $a_k \cdot b_k$ is (−86×85)=−7310; if both $a_k$ and $b_k$ are unsigned numbers, then the decimal representation of $a_k \cdot b_k$ is (170×85)=14450. It can be seen that if the multiply-accumulate circuit 10 itself is designed to execute the multiply-accumulate operation of signed numbers, an incorrect operation result is obtained once an unsigned number is input into the multiply-accumulate circuit 10, and if the multiply-accumulate circuit 10 is designed to execute the multiply-accumulate operation of unsigned numbers, an incorrect operation result is obtained once a signed number is input into the multiply-accumulate circuit 10.

Figure 2:
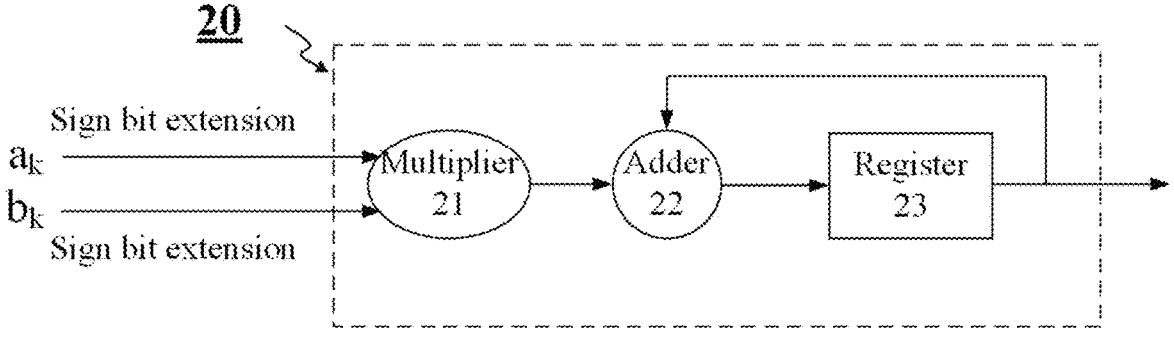

In order to enable a same multiply-accumulate circuit to be compatible with the multiply-accumulate operations of different data types, sign bit extension of $a_k$ and $b_k$ may be performed before $a_k$ and $b_k$ are fed into the multiply-accumulate circuit. Specifically, the sign bit is extended for a signed number (that is, the sign bit is supplemented to the high bit), and 0 is extended for an unsigned number (that is, 0 is supplemented to the high bit). For example, for the signed number 0101, it becomes 00101 after one bit extension, and becomes 00000101 after four bit extension. For the signed number 1010, it becomes 11010 after one bit extension, and becomes 11111010 after four bit extension. For the unsigned number 0101, it becomes 00101 after one bit extension, and becomes 00000101 after four bit extension. For the unsigned number 1010, it becomes 01010 after one bit extension, and becomes 00001010 after four bit extension. Specific number of the extended bits may be determined according to the designed bit width of the multiplier, or on the contrary, the multiplier may be designed according to the specific number of the extended bits. In general, extending only one bit to save the multiplier resource. The core of the sign bit extension is to extend only the bit width of the data without changing the value of the data. Before the sign bit extension, both $a_k$ and $b_k$ may be signed or unsigned numbers, but after the sign bit extension, both $a_k$ and $b_k$ are signed numbers. FIG. 2 shows a multiply-accumulate circuit 20. The multiply-accumulate circuit 20 includes a multiplier 21 supporting a signed number multiplied by a signed number and providing a signed output, an adder 22, and a register 23, and the multiply-accumulate circuit 20 is used to perform the multiply-accumulate operation on the sign bit extended $a_k$ and $b_k$. The multiply-accumulate circuit 20 may be compatible with the multiply-accumulate operations of different data types. However, on one hand, the sign bit extension causes an increase in the data bit width, so that a correspondingly designed multiplier 21 needs to consume more resources; on the other hand, the multiplier 21 performs the multiplication between a signed number and a signed number and provides a signed output, so that the subsequent data path (not only the adder 22, the register 23, and the like in the multiply-accumulate circuit 20, but also another circuit coupled to the output terminal of the multiply-accumulate circuit 20) becomes complicated, which increases the design difficulty, the circuit area, and the power consumption.

Alternatively, the multiply-accumulate operation sum of a signed number $a_k$ (assuming the bit width of z) and a signed number $b_k$ (assuming the bit width of w) may be unified as the operation of unsigned numbers by the mathematical derivations as follows.

$$\text{sum} = \sum_{k=1}^{x} a_k \cdot b_k$$

$$\text{sum} = \sum_{k=1}^{x} (a_k + 2^{z-1} - 2^{z-1}) \cdot (b_k + 2^{w-1} - 2^{w-1})$$

Let $A_k = a_k + 2^{z-1}$ (equivalent to negating the sign bit of $a_k$), and, let $B_k = b_k + 2^{w-1}$ (equivalent to negating the sign bit of $b_k$), sum =

$$\sum_{k=1}^{x} (A_k + 2^{z-1}) \cdot (b_k + 2^{w-1})$$

$$\text{sum} = \sum_{k=1}^{x} (A_k \cdot B_k - 2^{w-1} A_k - 2^{z-1} B_k + 2^{z+w-2})$$

$$\text{sum} = x \cdot 2^{z+w-2} + \sum_{k=1}^{x} [A_k \cdot B_k - (2^{w-1} A_k - 2^{z-1} B_k)]$$

Figure 3:
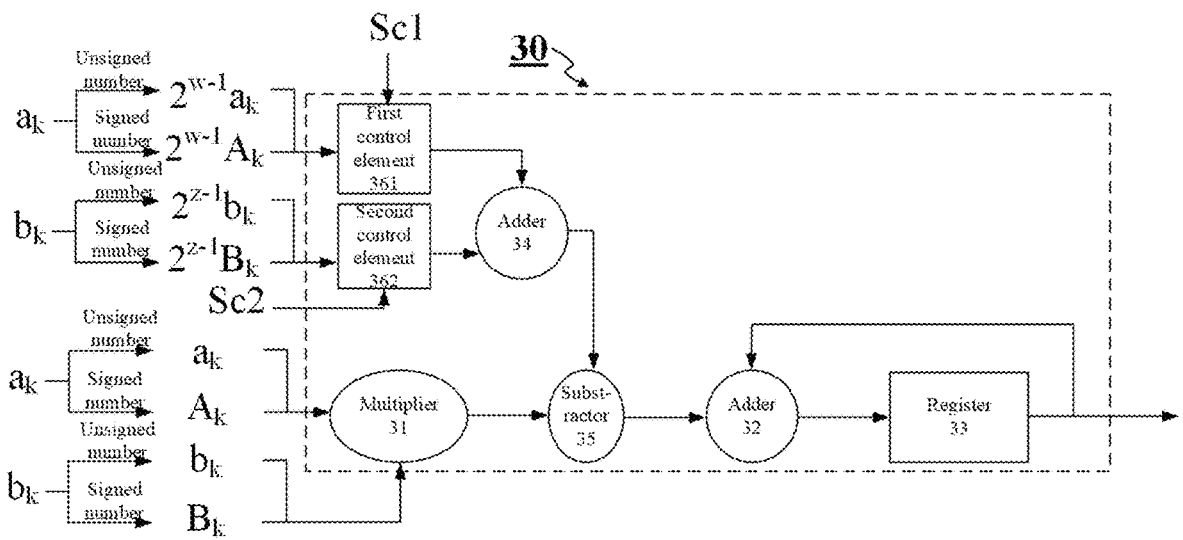

$x \cdot 2^{z+w-2}$ can be extracted as the constant term. $\Sigma_{k=1}^{x} [A_k \cdot B_k - (2^{w-1} A_k + 2^{z-1} B_k)]$ can be processed using a multiply-accumulate circuit 30 shown in FIG. 3. As shown in FIG. 3, the multiply-accumulate circuit 30 includes an adder 34 and a subtractor 35 in addition to the multiplier 31 supporting an unsigned number multiplied by an unsigned number and providing an unsigned output, the adder 32, and the register 33. The multiplier 31 is used to calculate $A_k \cdot B_k$, the adder 34 is used to calculate $(2^{w-1} A_k + 2^{z-1} B_k)$, the subtractor 35 is used to calculate $[A_k \cdot B_k - (2^{w-1} A_k + 2^{z-1} B_k)]$, and the adder 32 and the register 33 are used to accumulate.

Similarly, the multiply-accumulate operation sum of a signed number $a_k$ (assuming the bit width of z) and an unsigned number $b_k$ (assuming the bit width of w) may be unified as the operation of unsigned numbers by the mathematical derivations as follows.

$$\text{sum} = \sum_{k=1}^{x} a_k \cdot b_k$$

$$\text{sum} = \sum_{k=1}^{x} (a_k + 2^{z-1} - 2^{z-1}) \cdot b_k$$

Let $A_k = a_k + 2^{z-1}$ (equivalent to negating the sign bit of $a_k$), sum =

$$\sum_{k=1}^{x} (A_k + 2^{z-1}) \cdot b_k$$

$$\text{sum} = \sum_{k=1}^{x} (A_k \cdot B_k - 2^{z-1} b_k)$$

$\Sigma_{k=1}^{x} (A_k \cdot b_k - 2^{z-1} b_k)$ may also be processed using the multiply-accumulate circuit 30. However, a first control element 361 needs to be used to set the input at the first input terminal of the adder 34 to 0, and the second input terminal of the adder 34 may receive $2^{z-1} b_k$. Such a first control element 361 may be implemented by, for example, an AND gate. The first input terminal of the AND gate may receive the input ($2^{w-1} A_k$ or $2^{w-1} a_k$ that will be described later) expected to be processed by the adder 34, while the second input terminal may receive the control signal S1, and the output terminal may be coupled to the first input terminal of the adder 34. For the AND gate, the first input terminal of the adder 34 is prevented from receiving the input at the first input terminal of the AND gate by making Sc1=0, and the first input terminal of the adder 34 is allowed to receive the input at the first input terminal of the AND gate by making Sc1=1.

Similarly, the multiply-accumulate operation sum of an unsigned number $a_k$ (assuming the bit width of z) and a signed number $b_k$ (assuming the bit width of w) may be unified as the operation of unsigned numbers by mathematical derivations as follows.

$$\text{sum} = \sum_{k=1}^{x} a_k \cdot b_k$$

$$\text{sum} = \sum_{k=1}^{x} a_k \cdot (b_k + 2^{w-1} - 2^{w-1})$$

let $B_k = b_k + 2^{w-1}$ (equivalent to negating the sign bit of $b_k$), $$\text{sum} = \sum_{k=1}^{x} a_k \cdot (B_k - 2^{w-1})$$

$$\text{sum} = \sum_{k=1}^{x} (a_k \cdot B_k - 2^{w-1} a_k)$$

$\Sigma_{k=1}^{x} (a_k \cdot B_k - 2^{w-1} a_k)$ may also be processed using the multiply-accumulate circuit 30.

However, a second control element 362 needs to be used to set the input at the second input terminal of the adder 34 to 0, and the first input terminal of the adder 34 may receive $2^{w-1} a_k$. Such a second control element 362 may also be implemented by, for example, an AND gate. The first input terminal of the AND gate may receive the input ($2^{z-1} B_k$ or $2^{z-1} b_k$) expected to be processed by the adder 34, while the second input terminal may receive the control signal Sc2, and the output terminal may be coupled to the second input terminal of the adder 34. For the AND gate, the second input terminal of the adder 34 is prevented from receiving the input at the first input terminal of the AND gate by making Sc2=0, and the second input terminal of the adder 34 is allowed to receive the input at the first input terminal of the AND gate by making Sc2=1.

The multiply-accumulate operation for an unsigned number $a_k$ (assuming the bit width of z) and an unsigned number $b_k$ (assuming the bit width of w) sum=$\Sigma_{k=1}^{x} a_k \cdot b_k$ may also be processed using the multiply-accumulate circuit 30. In this case, the first control element 361 and the second control element 362 are configured to prevent the first input terminal and the second input terminal of the adder 34 from receiving the input at the first input terminal of the AND gate.

As such, the multiply-accumulate circuit 30 may be compatible with the multiply-accumulate operations of different data types. Because there is no need for the sign bit extension, the multiplier 31 of the multiply-accumulate circuit 30 can consume less resources than the multiplier 21 of the multiply-accumulate circuit 20. However, the multiply-accumulate circuit 30 has significantly more circuit elements than the multiply-accumulate circuit 20. On one hand, the multiply-accumulate circuit 30 has the additional adder 34 and the control elements 361 and 362 to process the additional accumulation terms, the resource consumption of the adder is very large, and the introduction of the control elements 361 and 362 also complicates the control logic. On the other hand, although the multiplier 31 supports an unsigned number multiplied by an unsigned number and provides an unsigned output, the multiply-accumulate circuit 30 further includes the subtractor 35 and still provides a signed output, so that the data path after the subtractor 35 (not only the adder 32, the register 33, and the like in the multiply-accumulate circuit 30, but also possibly including another circuit coupled to the output terminal of the multiply-accumulate circuit 30) becomes complicated, which increases the design difficulty, the circuit area, and the power consumption.

The inventors of the present disclosure note that in some application scenarios involving the multiply-accumulate operation of two groups of data, one group of data may be previously known. For example, in the convolution calculation unit of the neural network processor, the multiply-accumulate circuit needs to perform the multiply-accumulate operation on the activated data and the weight data. For a purpose of non-limiting description, the activated data may be image data, for example, an image photographed in real time by a camera and to be subject to target detection by a neural network model carried by the neural network processor, and the weight data comes from weight parameters of the neural network model. Because the weight parameters of the trained neural network model are fixed, the weight data is previously known. In contrast, the activated data is previously unknown and can be determined only when processing is to be performed. This feature can be used to optimize the operational circuit.

Specifically, the multiply-accumulate operation sum of the previously unknown $a_k$ (assuming the bit width of z) and the previously known $b_k$ (assuming the bit width of w) may be unified as the following operations by the mathematical derivations as follows.

When $a_k$ is an unsigned number and $b_k$ is a signed or unsigned number, $$\text{sum} = \sum_{k=1}^{x} a_k \cdot b_k$$

Therefore, $\Sigma_{k=1}^{x} a_k \cdot b_k$ is calculated using the multiply-accumulate circuit.

When $a_k$ is a signed number and $b_k$ is a signed or unsigned number, $$\text{sum} = \sum_{k=1}^{x} a_k \cdot b_k$$

$$\text{sum} = \sum_{k=1}^{x} \left(a_k + 2^{z-1} - 2^{z-1}\right) \cdot b_k$$

let $A_k = a_k + 2^{z-1}$ (equivalent to negating the sign bit of $a_k$), $$\text{sum} = \sum_{k=1}^{x} \left(A_k + 2^{z-1}\right) \cdot b_k$$

$$\text{sum} = \sum_{k=1}^{x} \left(A_k \cdot b_k - 2^{z-1} b_k\right)$$

Since $b_k$ is previously known, $(-2^{z-1} b_k)$ can be extracted as the constant term. Therefore, $\Sigma_{k=1}^{x} A_k \cdot b_k$ is also calculated only using the multiply-accumulate circuit.

Therefore, the present disclosure provides an operational circuit that is able to perform the multiply-accumulate operation of a plurality of pairs of first numbers and previously known second numbers using the foregoing operation principle. The following describes in detail the operational circuits according to various embodiments of the present disclosure with reference to the accompanying drawings. It should be understood that the actual operational circuit may further include additional components, which are not shown in the accompanying drawings and are not discussed in the present disclosure in order to avoid blurring the main point of the present disclosure.

Figure 4:
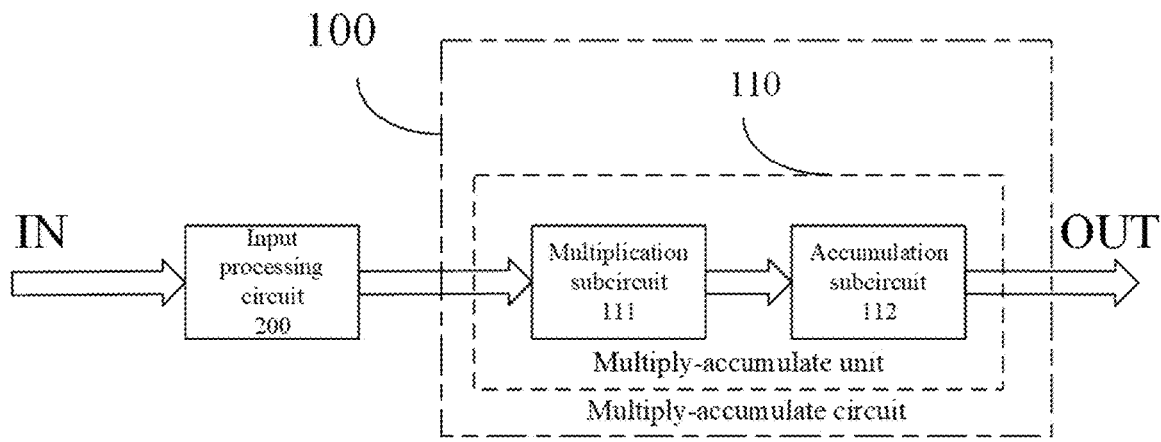
FIGS. 4 and 5 respectively show schematic block diagrams of operational circuits according to some embodiments of the present disclosure.

FIG. 4 shows the operational circuit 1000 used to perform the multiply-accumulate operation of a plurality of pairs of first numbers $a_k$ and second numbers $b_k$ according to some embodiments of the present disclosure, wherein the second numbers $b_k$ are previously known. It is assumed that the bit width of the first number $a_k$ is z and the bit width of the second number $b_k$ is w, which is merely for illustrative purpose and is not intended to limit that the bit widths of the first number $a_k$ and the second number $b_k$ are the same or different. In fact, the present disclosure may apply to the two cases in which the bit widths of the first number $a_k$ and the second number $b_k$ are the same and different. In many practical cases, the bit widths of the first number $a_k$ and the second number $b_k$ are the same.

As shown in FIG. 4, the operational circuit 1000 includes the multiply-accumulate circuit 100 and an input processing circuit 200. The input terminal of the input processing circuit 200 may provide the input terminal IN of the operational circuit 1000. The output terminal of the input processing circuit 200 is coupled to the input terminal of the multiply-accumulate circuit 100. The output terminal of the multiply-accumulate circuit 100 may provide the output terminal OUT of the operational circuit 1000.

Figure 5:
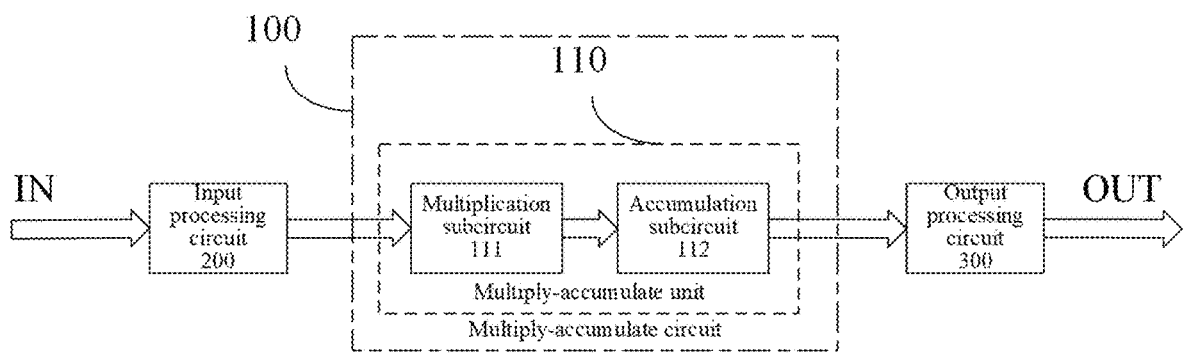

FIG. 5 shows another example 1000' of the operational circuit 1000, which further includes an output processing circuit 300 compared to the operational circuit 1000. The output terminal of the multiply-accumulate circuit 100 is coupled to the input terminal of the output processing circuit 300. The output terminal of the output processing circuit 300 may provide the output terminal OUT of the operational circuit 1000'. The output processing circuit 300 is used to process the extracted constant term in the foregoing mathematical derivations. Specifically, the output processing circuit 300 may be configured to subtract the first constant from the output of the multiply-accumulate circuit 100, the first constant is the sum of $(2^{z-1} b_k)$, wherein $(2^{z-1} b_k)$ is the second number $b_k$ after being shifted to left by $(z-1)$ bits, and the second numbers $b_k$ in the sum are all the second numbers of the plurality of pairs of first numbers $a_k$ and second numbers $b_k$ that are paired with the first numbers $a_k$ as signed numbers. In some cases, the operational circuit 1000 of FIG. 4 is enough, and the dedicated output processing circuit 300 is not required to process these constant terms. For example, in the convolution calculation unit of the neural network processor, in addition to performing the multiply-accumulate operation on the activated data and the weight data, the result of the multiply-accumulate operation needs to be added to a bias term. In the convolution calculation unit, a special hardware is responsible for the addition of the bias term. Therefore, the foregoing constant term may be integrated with the bias term in advance without paying the additional hardware cost for processing.

The input processing circuit 200 may be configured to receive the first number $a_k$ and the second number $b_k$. The input processing circuit 200 may be further configured to: in a case in which the first number $a_k$ is a signed number, output the first number $A_k$ as the first multiplicator for feeding into the multiplier of the multiply-accumulate circuit 100 by negating the sign bit of the first number $a_k$, and output the second number $b_k$ as the second multiplicator for feeding into the multiplier of the multiply-accumulate circuit 100. The input processing circuit 200 may be further configured to: in a case in which the first number $a_k$ is an unsigned number, output the first number $a_k$ as the first multiplicator for feeding into the multiplier of the multiply-accumulate circuit 100, and output the second number $b_k$ as the second multiplicator for feeding into the multiplier of the multiply-accumulate circuit 100. That is, the input processing circuit 200 does not perform any transformation on the previously known second number $b_k$, regardless of whether the second number $b_k$ is a signed or unsigned number. For the previously unknown first number $a_k$, the input processing circuit 200 only performs transformation of negating the sign bit on the first number $a_k$ as a signed number, but does not perform any transformation on the first number $a_k$ as an unsigned number.

Any suitable circuit may be designed to selectively perform the transformation of negating the sign bit on the first number $a_k$ according to the data type of the first number $a_k$.

Figure 6:
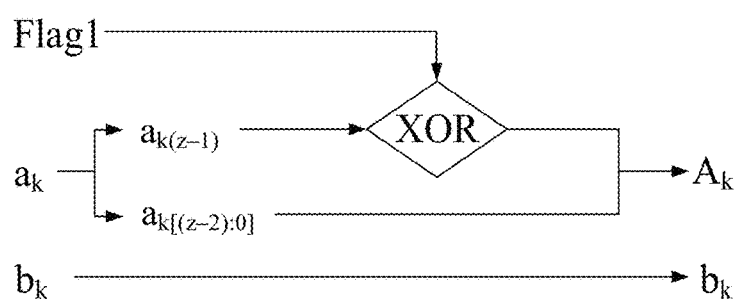
FIGS. 6 to 9 respectively show example circuit diagrams of input processing circuits for implementing the operational circuits of FIGS. 4 and 5 according to some embodiments of the present disclosure.

In some embodiments, the input processing circuit 200 may include an exclusive-OR gate, configured to receive the highest bit of the first number $a_k$ and the sign flag bit indicating whether the first number $a_k$ is an unsigned or signed number, and to perform the exclusive-OR operation thereon, wherein the exclusive-OR operation result of the exclusive-OR gate is provided as the highest bit of the first number $A_k$ output by the input processing circuit 200. FIG. 6 illustrates an example 200A of the input processing circuit 200, which includes the exclusive-OR gate XOR. The exclusive-OR gate XOR receives the highest bit $a_{k(z-1)}$ of the first number $a_k$ and the sign flag bit Flag1 indicating whether the first number $a_k$ is an unsigned or signed number, and performs the exclusive-OR operation thereon. Flag1=0 indicates that the first number $a_k$ is an unsigned number, and in this case, the output of the exclusive-OR gate XOR is $a_{k(z-1)}$. Flag1=1 indicates that the first number $a_k$ is a signed number, and in this case, the output of the exclusive-OR gate XOR is the negation result of $a_{k(z-1)}$. The output of the exclusive-OR gate XOR is concatenated with other bits $a_{k(z-2):0}$ of the first number $a_k$ other than the highest bit $a_{k(z-1)}$ to obtain $A_k$. In addition, the input processing circuit 200 does not perform any transformation on the second number $b_k$, so that $b_k$ can be directly output.

Figure 7:
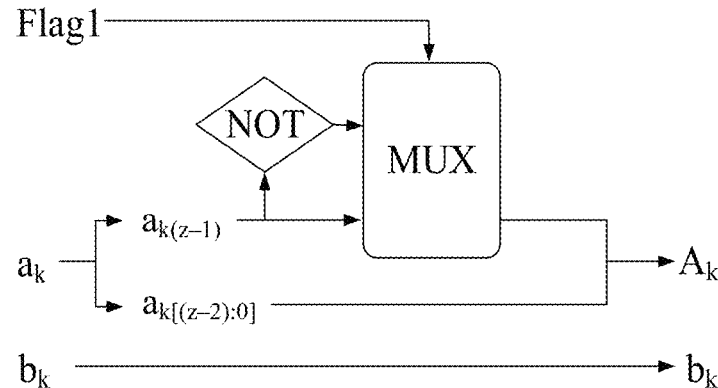

Alternatively, in some other embodiments, the input processing circuit 200 may further include a multiplexer that may be configured to receive the highest bit of the first number $a_k$ as the first input, to receive the negation result of the highest bit of the first number $a_k$ as the second input, to receive the sign flag bit indicating whether the first number $a_k$ is an unsigned or signed number as the selection signal, and to output the first input or the second input according to the selection signal. The output of the multiplexer may be provided as the highest bit of the first number $A_k$ output by the input processing circuit 200. A NOT gate may be used to receive the highest bit of the first number $a_k$ and to perform the NOT operation thereon to obtain the negation result of the highest bit of the first number $a_k$. FIG. 7 illustrates an example 200B of the input processing circuit 200 that includes the multiplexer MUX and the NOT gate NOT. The NOT gate NOT is used to obtain the negation result of the highest bit $a_{k(z-1)}$ of the first number $a_k$. The multiplexer MUX receives the highest bit $a_{k(z-1)}$ of the first number $a_k$ as the first input, receives the negation result of the highest bit $a_{k(z-1)}$ of the first number $a_k$ as the second input, receives the sign flag bit Flag1 indicating whether the first number $a_k$ is an unsigned or signed number as the selection signal, and outputs the first input or the second input according to the selection signal. The selection signal Flag1=0 indicates that the first number $a_k$ is an unsigned number, and in this case, the output of the multiplexer MUX is the first input, that is, $a_{k(z-1)}$. The selection signal Flag1=1 indicates that the first number $a_k$ is a signed number, and in this case, the output of the multiplexer MUX is the second input, that is, the negation result of $a_{k(z-1)}$. The output of the multiplexer MUX is concatenated with other bits $a_{k(z-2):0}$ of the first number $a_k$ other than the highest bit $a_{k(z-1)}$ to obtain $A_k$. In addition, the input processing circuit 200 does not perform any transformation on the second number $b_k$, so that $b_k$ can be directly output.

The multiply-accumulate circuit 100 may be designed to adapt to the bit widths of the first number $a_k$ and the second number $b_k$. Instead, the first number $a_k$ and the second number $b_k$ may be split according to the multiply-accumulate circuit 100, especially the design bit width of the multiplier of the multiply-accumulate circuit 100. Taking that the bit widths of the first number $a_k$ and the second number $b_k$ are 2r, the design bit width of the multiplier is r as an example, the operation principle of splitting is described as follows.

$$\text{sum} = \sum_{k=1}^{x} a_k \cdot b_k$$

$$\text{sum} = \sum_{k=1}^{x} (a_{kh} \cdot 2^r + a_{kl}) \cdot (b_{kh} \cdot 2^r + b_{kl})$$

$$\text{sum} = \sum_{k=1}^{x} \left( a_{kh} \cdot b_{kh} \cdot 2^{2r} + a_{kl} \cdot 2^r + a_{kh} \cdot b_{kl} \cdot 2^r + a_{kl} \cdot b_{kl} \right)$$

$a_{kh}$ is the highest r bits of the first number $a_k$, $a_{kl}$ is the lowest r bits of the first number $a_k$, $b_{kh}$ is the highest r bits of the second number $b_k$, and $b_{kl}$ is the lowest r bits of the second number $b_k$. Therefore, one multiplication operation with the large bit width 2r may be equivalent to four multiplication operations with the small bit width r. "$\cdot 2^{2r}$" and "$\cdot 2^r$" are shift operations, respectively representing shift by 2r bits to left and shift by r bits to left, which may be performed by the shifter.

Figure 8:
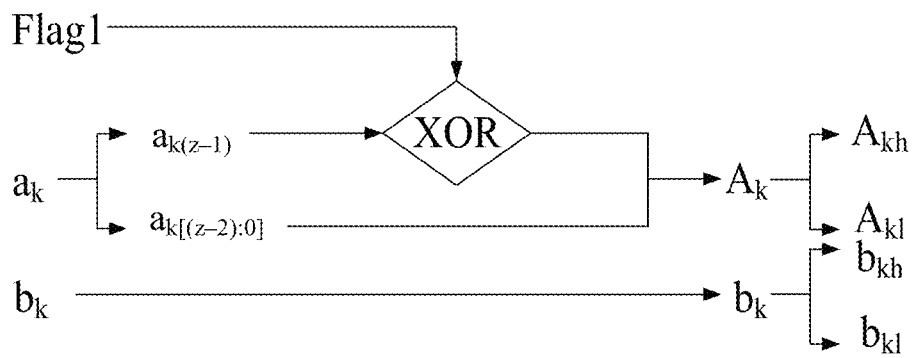
Figure 9:
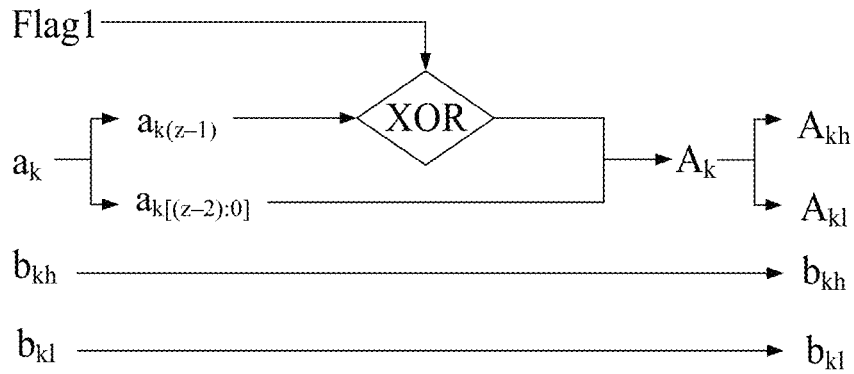

Thus, in some embodiments, the input processing circuit 200 may be further configured to split the first number $a_k$ according to the bit width of the multiplier of the multiply-accumulate circuit 100, and the multiply-accumulate circuit 100 further includes the shifter coupled to the output terminal of the multiplication subcircuit 111, and the shifter is configured to perform the shift operation corresponding to splitting. In addition, splitting of the previously known second number $b_k$ may also be performed by the input processing circuit 200, that is, the input processing circuit 200 may further be configured to split the second number $b_k$ according to the bit width of the multiplier of the multiply-accumulate circuit 100. FIG. 8 illustrates an example 200C of the input processing circuit 200, which further splits $A_k$ into $A_{kh}$ (the high bit portion of $A_k$) and $A_{kl}$ (the low bit portion of A) and splits $b_k$ into $b_{kh}$ (the high bit portion of $b_k$) and $b_{kl}$ (the low bit portion of $b_k$) compared to example 200A. Note that the splitting shown herein is for illustrative purposes only and is not limiting, for example, each of $A_k$ and $b_k$ may also be split into more portions, and the bit width of each portion may be the same or different. However, since the second number $b_k$ is previously known, its splitting may be pre-processed (for example, via a software such as a compiler and the like), the input processing circuit 200 may be alternatively configured to receive the second number $b_k$ split in advance according to the bit width of the multiplier. FIG. 9 illustrates an example 200D of the input processing circuit 200, which does not perform splitting of $b_k$ compared to example 200C, but directly receives $b_{kh}$ and $b_{kl}$ split in advance. Thus, the hardware cost of example 200D is less than that of example 200C because corresponding circuit components used for splitting $b_k$ are eliminated. It may be understood that although FIGS. 8 and 9 show that the transformation is performed before the splitting, the splitting before the transformation is also feasible.

After the input processing circuit 200 processes the first number and the second number, the multiply-accumulate circuit 100 will perform the multiply-accumulate operation of the first numbers as an unsigned numbers and the previously known second numbers. Referring back to FIGS. 4 and 5, the multiply-accumulate circuit 100 may include at least one multiply-accumulate unit 110. The multiply-accumulate unit 110 includes the multiplication subcircuit 111 and the accumulation subcircuit 112. The multiplication subcircuit 111 may include the multiplier used to perform the multiplication operation of the first multiplicator and the second multiplicator. The first multiplicator is obtained from the first number (for example, processed by the input processing circuit 200) and is an unsigned number. The second multiplicator is obtained from the second number (for example, processed by the input processing circuit 200) and is the previously known unsigned or signed number. The multiplier of the multiplication subcircuit 111 supports both an unsigned number multiplied by an unsigned number and an unsigned number multiplied by a signed number, and is configured to provide the output as an unsigned number. The input terminal of the accumulation subcircuit 112 is coupled to the output terminal of the multiplication subcircuit 111. The accumulation subcircuit 112 is configured to receive and to accumulate the output of the multiplication subcircuit 112.

In some embodiments, the multiplication subcircuit 111 may include one or more multipliers, and each of the one or more multipliers is configured to receive a corresponding pair of first multiplicator and second multiplicator and to obtain a product of the corresponding pair of first multiplicator and second multiplicator. The multiplier in the multiplication subcircuit 111 may be the multiplier with a single output terminal, or may be the multiplier with two output terminals. This may be configured according to a specific requirement. Parallel calculation may be implemented when the multiplication subcircuit 111 includes a plurality of multipliers.

In some embodiments, the accumulation subcircuit 112 may include n stages of compression trees, a first adder, a second adder, and a register group. The output terminal of the multiplication subcircuit 111 is coupled to a corresponding input terminal of the first-stage of compression tree in the n stages of compression trees, the output terminal of the $i^{th}$-stage of compression tree in the n stages of compression trees is coupled to a corresponding input terminal of the $(i+1)^{th}$-stage of compression tree in the n stages of compression trees, the output terminal of the $n^{th}$-stage of compression tree in the n stages of compression trees is coupled to a corresponding input terminal of the first adder, the output terminal of the first adder is coupled to a corresponding input terminal of the second adder, the output terminal of the second adder is coupled to the input terminal of the register group, and the output terminal of the register group is coupled to a corresponding input terminal of the second adder, wherein n is a positive integer, and i=1, 2, . . . , n−1.

In some embodiments, the accumulation subcircuit 112 may include n stages of compression trees, a full adder, an adder, and a register group. The output terminal of the multiplication subcircuit 111 is coupled to a corresponding input terminal of the first-stage of compression tree in the n stages of compression trees, the output terminal of an $i^{th}$-stage of compression tree in the n stages of compression trees is coupled to a corresponding input terminal of the $(i+1)^{th}$-stage of compression tree in the n stages of compression trees, the output terminal of the $n^{th}$-stage of compression tree in the n stages of compression trees is coupled to a corresponding input terminal of the full adder, the output terminal of the full adder is coupled to a corresponding input terminal of the adder, the output terminal of the adder is coupled to the input terminal of the register group, and the output terminal of the register group is coupled to a corresponding input terminal of the full adder, wherein n is a positive integer, and i=1, 2, . . . , n−1.

In some embodiments, the accumulation subcircuit 112 may include n stages of compression trees, an adder, and a register group. The output terminal of the multiplication subcircuit 111 is coupled to a corresponding input terminal of the first-stage of compression tree in the n stages of compression trees, the output terminal of the $i^{th}$-stage of compression tree in the n stages of compression trees is coupled to a corresponding input terminal of the $(i+1)^{th}$-stage of compression tree in the n stages of compression trees, the output terminal of the $n^{th}$-stage of compression tree in the n stages of compression trees is coupled to a corresponding input terminal of the adder, the output terminal of the adder is coupled to the input terminal of the register group, the output terminal of the register group is coupled to a corresponding input terminal of the first-stage of compression tree in the n stages of compression trees, wherein n is a positive integer, and i=1, 2, . . . , n−1.

Each stage of compression tree in the n stages of compression trees may include one compression tree or a plurality of parallel compression trees. The common compression tree includes the compression tree with two output terminals such as the 4:2 compression tree, the 3:2 compression tree and the like; and further includes the compression tree with three output terminals such as the 5:3 compression tree, the 6:3 compression tree, the 7:3 compression tree and the like. The compression tree used in the accumulation subcircuit 112 may be the existing or to be developed compression tree with any number of input terminals and output terminals, or may be a compression tree module with any number of input terminals and output terminals implemented by a combination of a plurality of currently existing compression trees, as long as the compression of the output results of the multiplication subcircuit 111 can be implemented.

In some other embodiments, the compression tree may alternatively be implemented as a combination of a full adder and a half adder or a full adder. For example, in some embodiments, the accumulation subcircuit 112 may include the full adder module with one or more stages of full adders, an adder, and a register group. The output terminal of the multiplication subcircuit 111 is coupled to a corresponding input terminal of the full adder module, the output terminal of the full adder module is coupled to a corresponding input terminal of the adder, the output terminal of the adder is coupled to the input terminal of the register group, and the output terminal of the register group is coupled to a corresponding input terminal of the full adder module.

The number of the registers included in the register group may depend on the bit width of the register and the bit width of the input data. In addition, similar to the register group, the number of the circuit elements of various circuit element groups (including the AND gate group, the NOT gate group, the NAND gate group, the exclusive-OR gate group, the multiplexer group, the inverse multiplexer group, and the like) mentioned elsewhere herein may depend on the designed bit width of the circuit.

For non-limiting illustrative purposes, FIGS. 10 to 17 respectively show example circuit diagrams of the multiply-accumulate circuits 100 for implementing the operational circuits 1000 and 1000' of FIGS. 4 and 5 according to some embodiments of the present disclosure.

Figure 10:
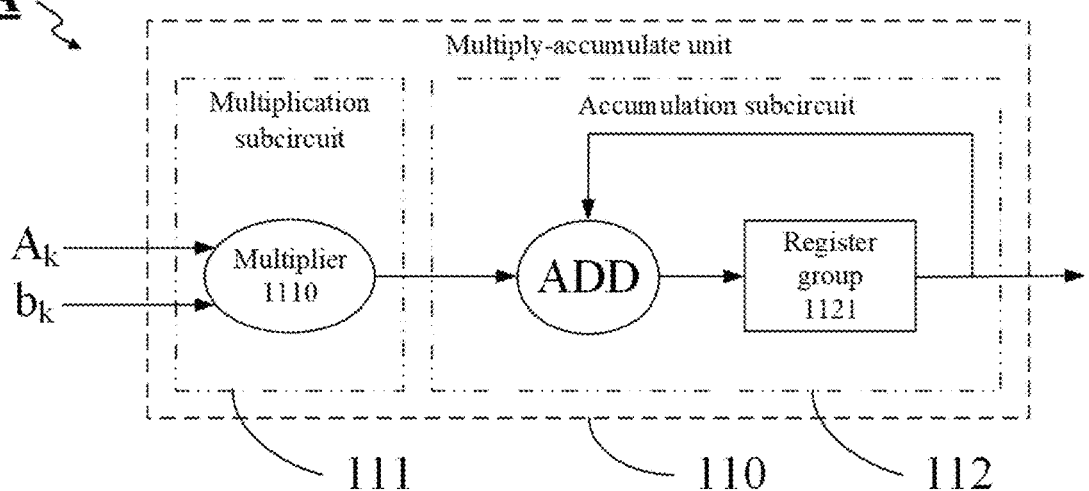
FIGS. 10 to 17 respectively show example circuit diagrams of multiply-accumulate circuits for implementing the operational circuits of FIGS. 4 and 5 according to some embodiments of the present disclosure.

As shown in FIG. 10, the multiply-accumulate circuit 100A includes the multiply-accumulate unit 110, and the multiply-accumulate unit 110 includes the multiplication subcircuit 111 and the accumulation subcircuit 112. In the example of FIG. 10, the multiplication subcircuit 111 includes the multiplier 1110 with the single output terminal. It is assumed that the multiply-accumulate circuit 100A is used for multiplication and accumulation of x pairs of numbers ($a_1 \cdot b_1 + a_2 \cdot b_2 + \ldots a_x \cdot b_x$, x is a positive integer), wherein $a_k$ (k=1, 2, ..., x) has been processed as $A_k$ by, for example, the input processing circuit 200A of FIG. 6, then in each of x periods, a corresponding pair of numbers $A_k$ and $b_k$ of the x pairs of numbers may be fed into the multiplier 1110 as the first multiplicator and the second multiplicator respectively, the multiplier 1110 calculates the product $A_k \cdot b_k$ of this pair of numbers and provides an unsigned output, and then $A_k \cdot b_k$ is accumulated via the accumulation subcircuit 112. The accumulation subcircuit 112 includes the adder ADD and the register group 1121. The first input terminal of the adder ADD is coupled to the output terminal of the multiplier 1110, the second input terminal of the adder ADD is coupled to the output terminal of the register group 1121, and the output terminal of the adder ADD is coupled to the input terminal of the register group 1121. It is assumed that the x pairs of numbers to be calculated by the multiply-accumulate circuit 100A are sequentially fed to the multiplier 1110 from 1 to x, then the result stored in the register group 1121 at the end of the first period is $A_1 \cdot b_1$, the result stored in the register group 1121 at the end of the second period is ($A_1 \cdot b_1 + A_2 \cdot b_2$), until the result stored in the register group 1121 at the end of the xth period is ($A_1 \cdot b_1 + A_2 \cdot b_2 + \ldots A_x \cdot b_x$).

Compared to the multiply-accumulate circuit 20 of FIG. 2, the multiplier 1110 of the multiply-accumulate circuit 100A of FIG. 10 provides an unsigned output, so that the subsequent data path is simple, which reduces the design difficulty, the circuit area, and the power consumption. Compared to the multiply-accumulate circuit 30 of FIG. 3, the multiply-accumulate circuit 100A of FIG. 10 has the reduced number of components (one adder, one subtractor, and two control elements are reduced), and does not require complex control logic, and the subsequent data path of the multiplier 1110 is unsigned, which reduces the design difficulty, the circuit area, and the power consumption.

Figure 11:
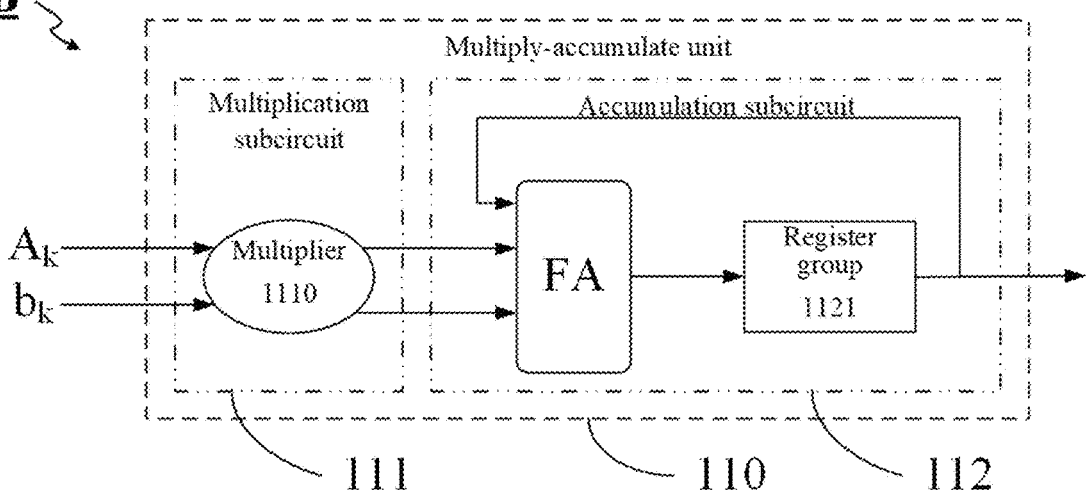

FIG. 11 shows the multiply-accumulate circuit 100B that differs from the multiply-accumulate circuit 100A of FIG. 10 in that the multiplier 1110 changes from a single output terminal to two output terminals, and accordingly the adder ADD changes to a full adder (FA). The multiplier typically includes three portions, the partial product generation portion, the partial product accumulation portion, and the final adding portion. The multiplier with two output terminals can reduce the final adding portion, that is, one adder, compared to the multiplier with the single output terminal, so that employing the multiplier with two output terminals can achieve reduced power consumption compared to employing the multiplier with the single output terminal. In addition, replacing the adder ADD with the full adder FA also brings reduced power consumption.

Figure 12:
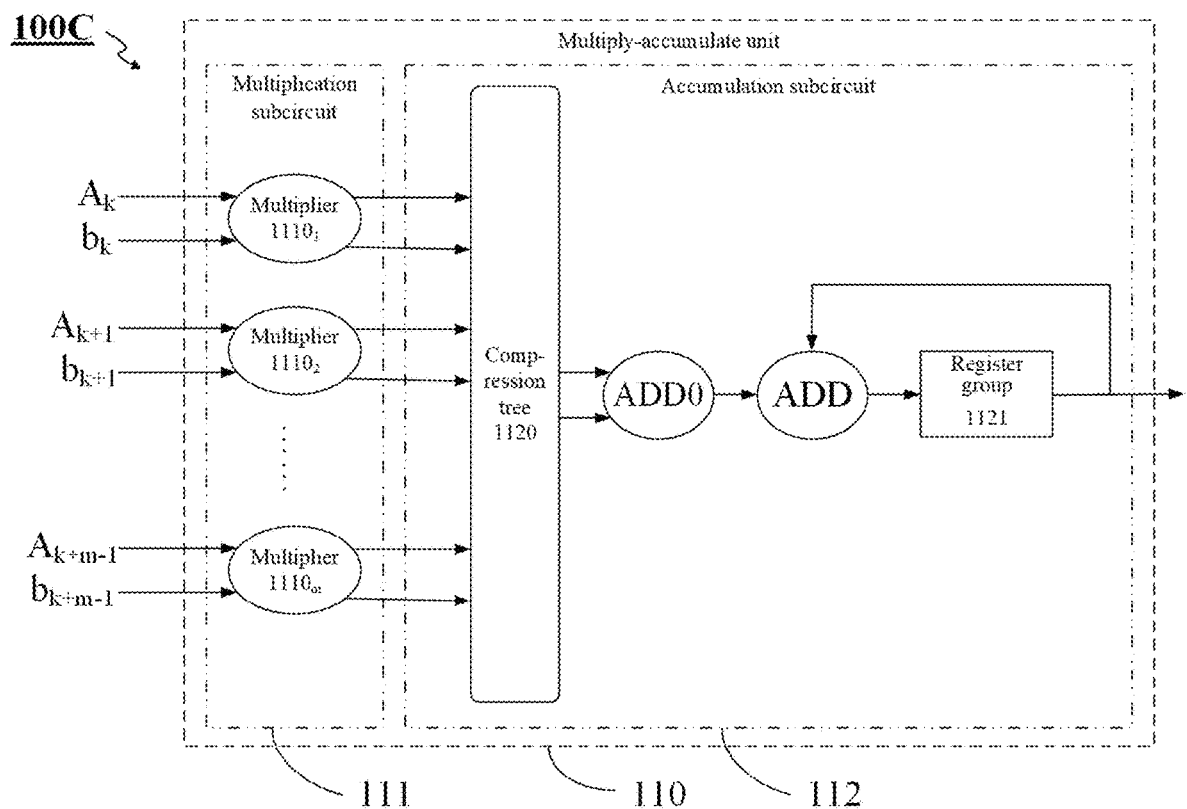

FIG. 12 shows the multiply-accumulate circuit 100C that differs from the multiply-accumulate circuit 100A of FIG. 10 in that the multiplication subcircuit 111 includes m parallel multipliers $1110_1$, $1110_2$, ..., and $1110_m$ (m is a positive integer greater than 1), and accordingly the accumulation subcircuit 112 further includes a 2m:2 compression tree 1120 and an adder ADD0, wherein the output terminals of the multipliers $1110_1$, $1110_2$, ..., and $1110_m$ are coupled to corresponding input terminals of the compression tree 1120, the output terminals of the compression tree 1120 are coupled to corresponding input terminals of the adder ADD0, and the output terminal of the adder ADD0 is coupled to the input terminal of the adder ADD. When the 2m:2 compression tree cannot be designed conveniently, a combination of existing compression trees may be used to implement the compression from m inputs to 2 outputs. By means of the parallel design of multipliers, the multiply-accumulate circuit 100C can implement multiplication and accumulation of m pairs of numbers in each period. Compared to x periods each required by the multiply accumulate circuits 100A and 100B of FIGS. 10 and 11, the multiply-accumulate circuit 100C only needs (x/m) periods, thereby having the improved operation efficiency. The number m of the parallel multipliers may be flexibly configured according to an actual requirement.

In contrast, the multiply-accumulate circuit 20 of FIG. 2 is difficult to implement the parallel calculation of the multiplier 21, because the multiplier 21 provides a signed output, which makes the design of the compression tree become extremely complex. Therefore, the operation efficiency of the multiply-accumulate circuit 20 is relatively low. For the multiply-accumulate circuit 30 of FIG. 3, although its multiplier 31 provides an unsigned output so that the compression tree can be relatively easily designed for parallel calculation, at the same time, a plurality of adders 34 and related control elements 361 and 362 need to be correspondingly added for a plurality of multipliers 31, which makes the number of circuit elements greatly increase, thereby increasing the circuit area and the power consumption.

Figure 13:
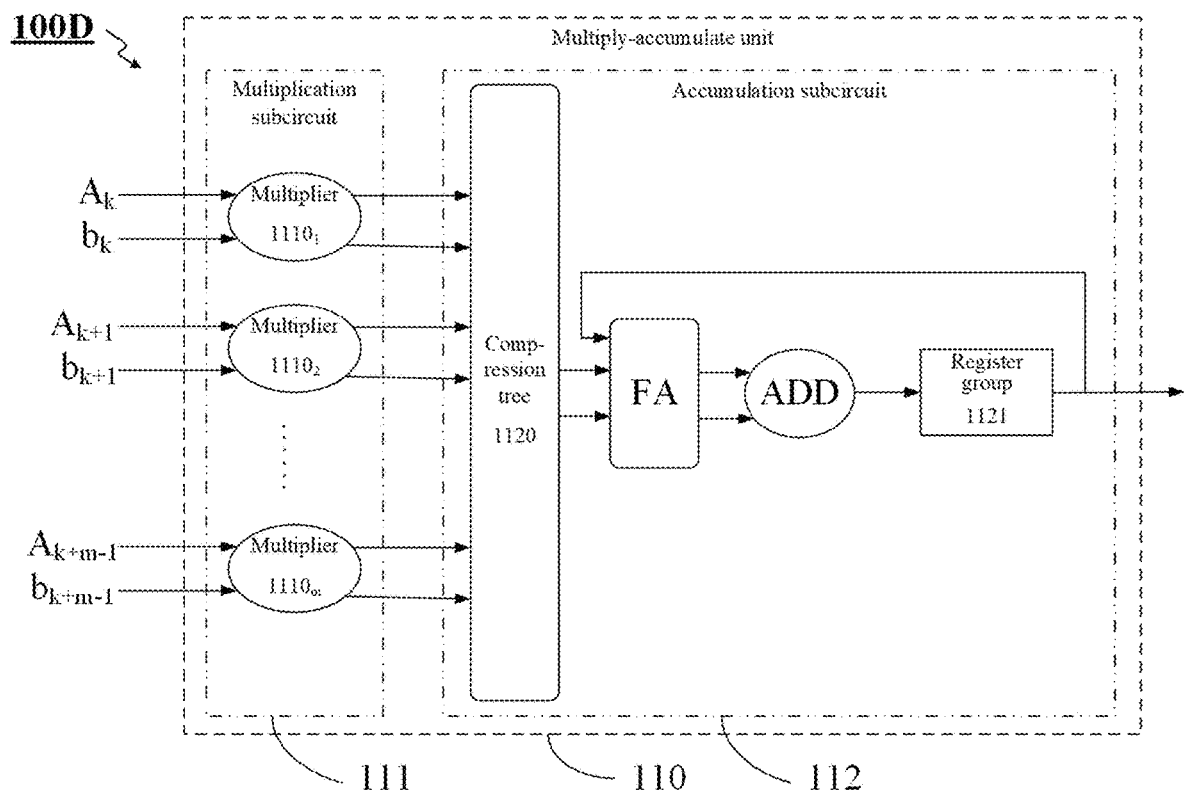

FIG. 13 shows the multiply-accumulate circuit 100D that differs from the multiply-accumulate circuit 100C of FIG. 12 in that the adder ADD0 is replaced by a full adder FA, wherein the output terminals of the compression tree 1120 are coupled to corresponding input terminals of the full adder FA, the output terminals of the full adder FA are coupled to corresponding input terminals of the adder ADD, and the output terminal of the register group 1121 changes to be coupled to a corresponding input terminal of the full adder FA. By replacing the adder ADD0 with the full adder FA, the multiply-accumulate circuit 100D implements the saved resources and the reduced power consumption.

Figure 14:
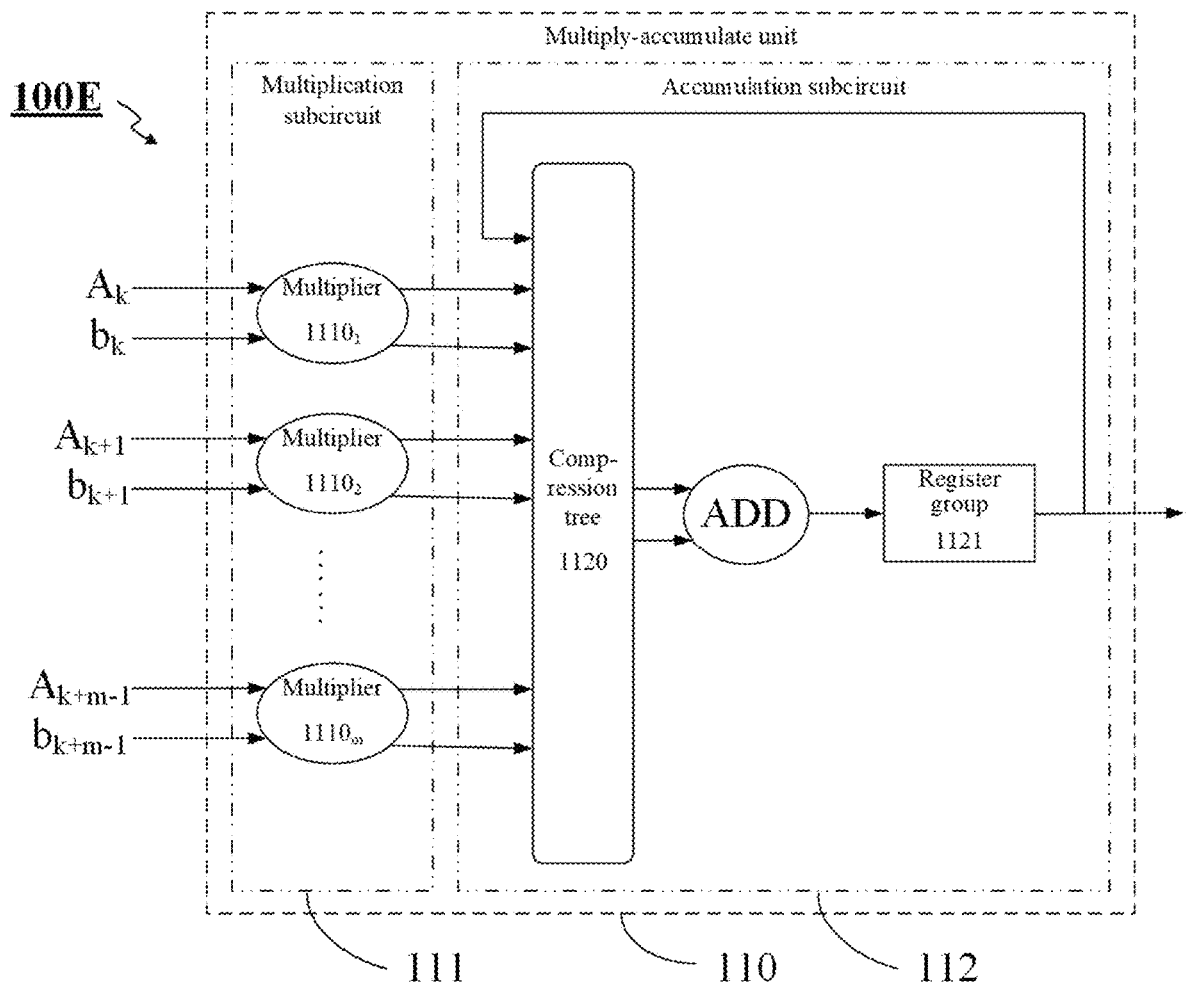

FIG. 14 shows the multiply-accumulate circuit 100E that differs from the multiply-accumulate circuit 100D of FIG. 13 in that the full adder FA is omitted, wherein the output terminals of the compression tree 1120 are coupled to corresponding input terminals of the adder ADD, and the output terminal of the register group 1121 changes to be coupled to a corresponding input terminal of the compression tree 1120.

Figure 15:
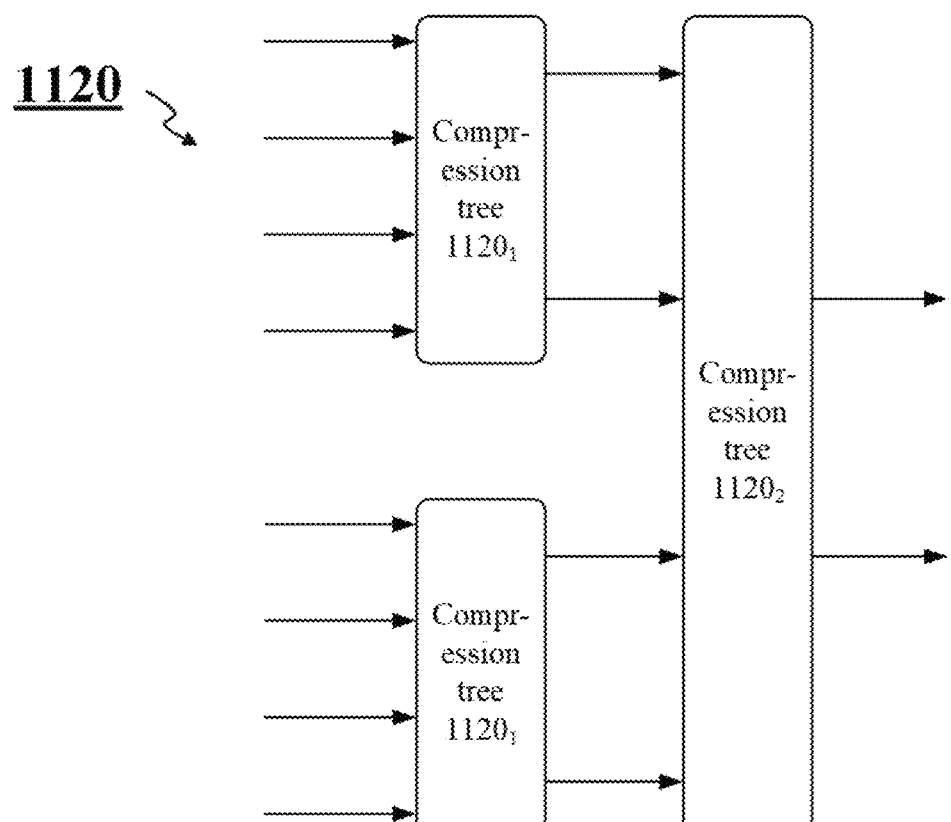

FIG. 15 shows an example arrangement of the compression tree 1120 that may be used for each of FIGS. 12 to 14. As shown in FIG. 15, the compression tree 1120 includes two stages of compression trees, wherein the first-stage of compression tree includes two parallel compression trees $1120_1$, and the second-stage of compression tree includes one compression tree $1120_2$. FIG. 15 is equivalent to using a combination of three 4:2 compression trees to implement one 8:2 compression tree. From another perspective, when FIG. 15 and FIGS. 12 to 14 employ the same type of compression tree, the former can accommodate a larger multiplier scale, thereby further improving the circuit processing performance. In addition, although not shown in FIG. 15, a register group may be further interposed between two stages of compression trees after dividing a stage of compression tree into two stages of compression trees, so as to implement an improved timing.

Figure 16:
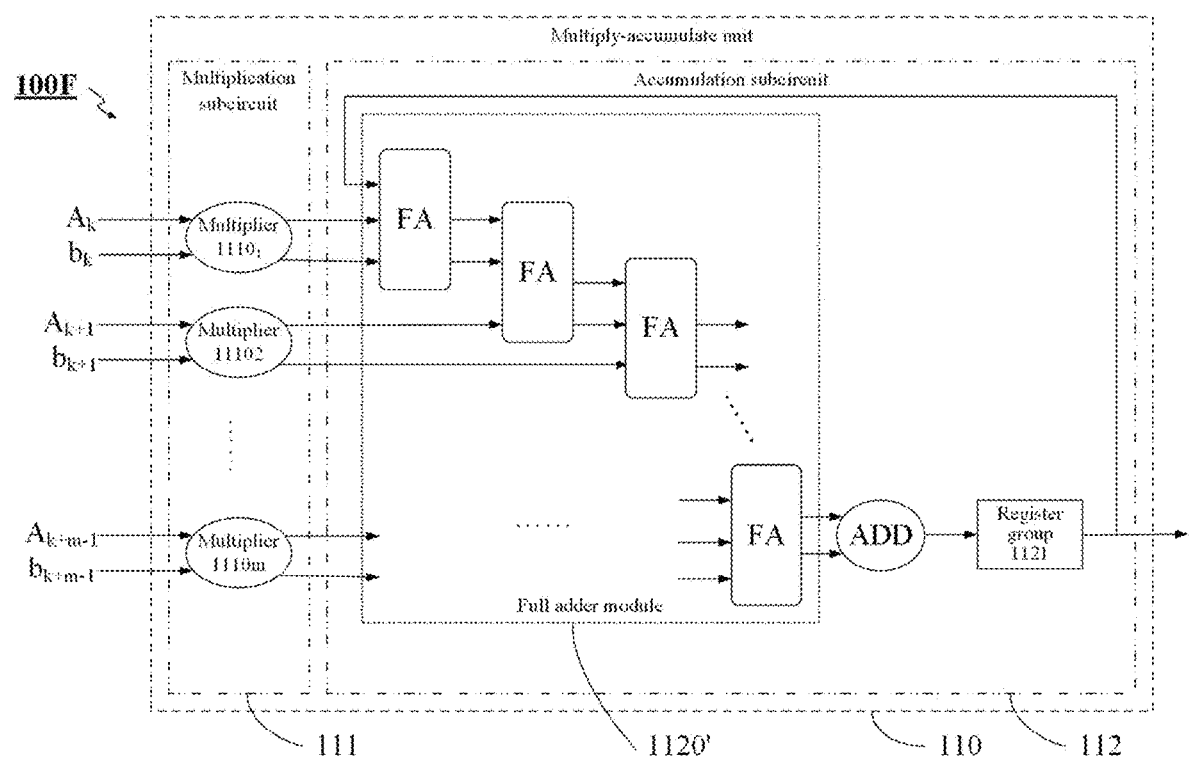

FIG. 16 shows the multiply-accumulate circuit 100F that differs from the multiply-accumulate circuit 100E of FIG. 14 in that the compression tree 1120 is replaced by a full adder module 1120' with a plurality of stages of full adders FAs.

Figure 17:
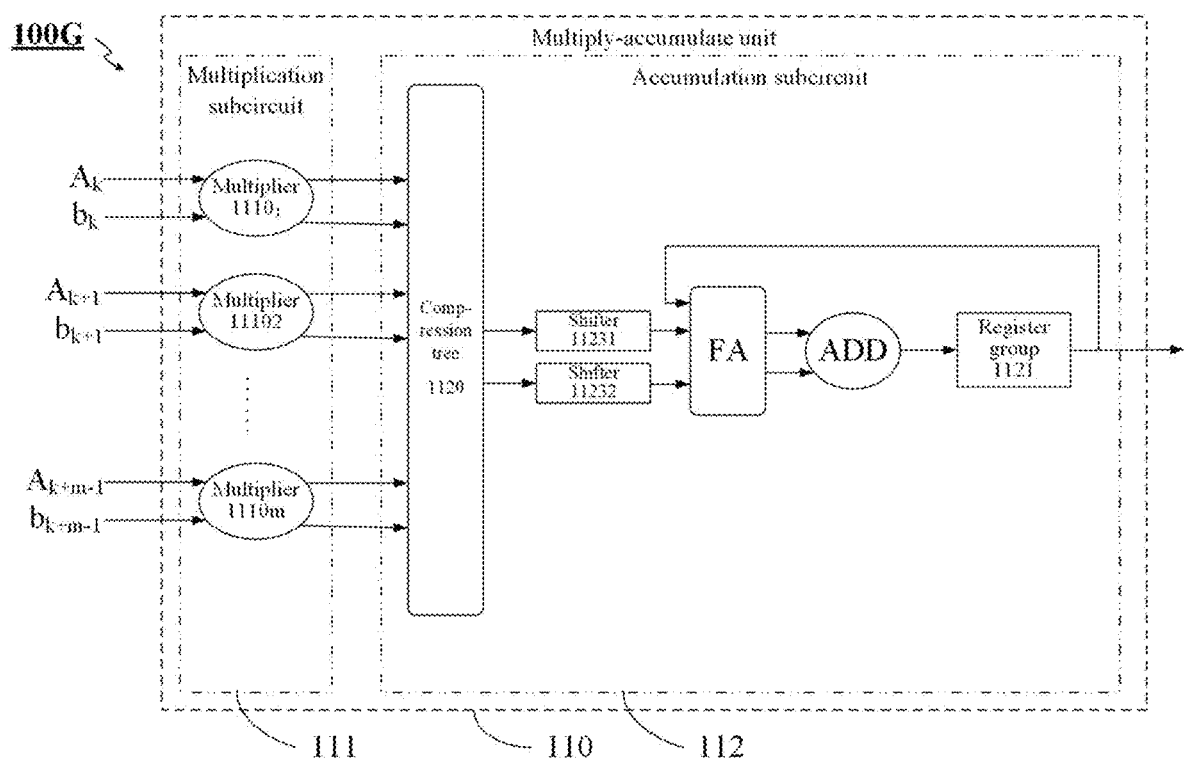

FIG. 17 shows the multiply-accumulate circuit 100G that differs from the multiply-accumulate circuit 100D of FIG. 13 in that the shifters 11231 and 11232 are further disposed between the output terminals of the compression tree 1120 and the corresponding input terminals of the full adder FA. For example, assuming that $A_k$ and $b_k$ are processed via the input processing circuit 200 in FIGS. 8 and 9, the shift operation corresponding to splitting performed by the input processing circuit 200 may be implemented by the shift configurations of the shifters 11231 and 11232. Therefore, the multiply-accumulate circuit 100G has the capability of supporting the hybrid bit multiply-accumulate operation. As an alternative scheme, a corresponding shifter may be disposed between each output terminal of each multiplier 1110 and a corresponding input terminal of the compression tree 1120, but this obviously requires much more shifters, resulting in unnecessary increases in the circuit area and the power consumption.

It may be understood that, all the foregoing multiply-accumulate circuits may be added with the shifter to increase the capability of supporting the hybrid bit multiply-accumulate operation. For example, in FIG. 10, the shifter may be added between the output terminal of the multiplier 1110 and the input terminal of the adder ADD. In FIG. 11, the shifter may be added between each output terminal of the multiplier 1110 and a corresponding input terminal of the full adder FA. In FIG. 12, the shifter may be added between each output terminal of each multiplier 1110 and a corresponding input terminal of the compression tree 1120, or the shifter may be added between each output terminal of the compression tree 1120 and a corresponding input terminal of the adder ADD0, or the shifter may be added between the output terminal of the adder ADD0 and the input terminal of the adder ADD. In FIG. 13, the shifter may be added between each output terminal of each multiplier 1110 and a corresponding input terminal of the compression tree 1120, or the shifter may be added between each output terminal of the compression tree 1120 and a corresponding input terminal of the full adder FA. In FIG. 14, the shifter may be added between each output terminal of each multiplier 1110 and a corresponding input terminal of the compression tree 1120. In FIG. 16, the shifter may be added between each output terminal of each multiplier 1110 and a corresponding input terminal of the full adder module 1120'.

Figure 18:
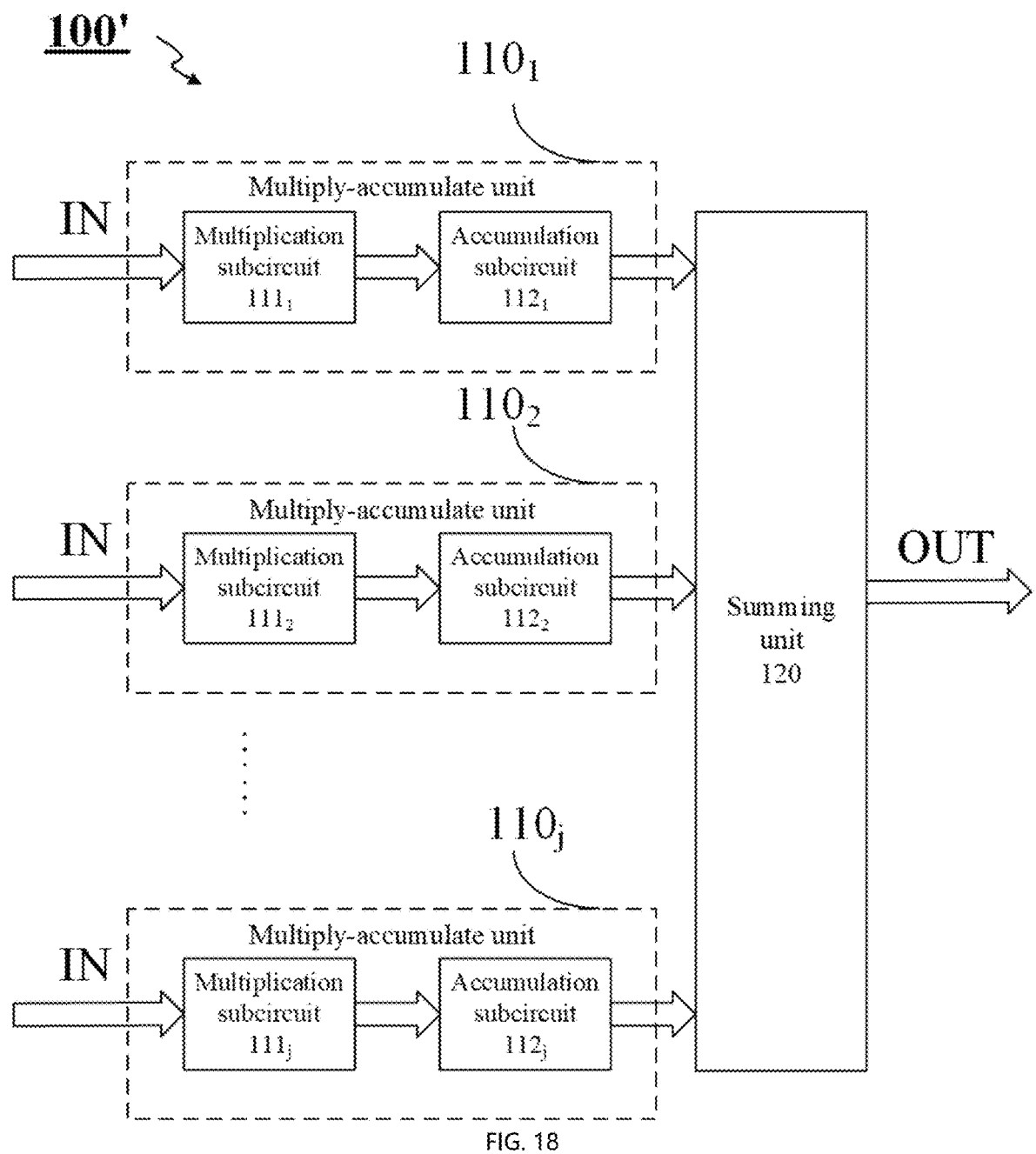
FIG. 18 shows a schematic block diagram of a multiply-accumulate circuit for implementing the operational circuits of FIGS. 4 and 5 according to some embodiments of the present disclosure.

FIG. 18 shows the multiply-accumulate circuit 100' that may be used to implement the multiply-accumulate circuit 100 of the operational circuit 1000 and 1000' of FIGS. 4 and 5 according to some embodiments of the present disclosure. The multiply-accumulate circuit 100' includes two or more multiply-accumulate units $110_1$, $110_2$, . . . , $110_j$ (j is a positive integer greater than 1) and a summing unit 120. The output terminal of each of the multiply-accumulate units $110_1$, $110_2$, . . . , $110_j$ is coupled to a corresponding input terminal of the summing unit 120. The input terminal of each of the multiply-accumulate units $110_1$, $110_2$, . . . , $110_j$ may provide an input terminal IN of the multiply-accumulate circuit 100', and the output terminal of the summing unit 120 may provide an output terminal OUT of the multiply-accumulate circuit 100'.

The multiply-accumulate units $110_1$, $110_2$, . . . , $110_j$ each include the multiplication subcircuits $111_1$, $111_2$, . . . , $111_j$ and the accumulation subcircuits $112_1$, $112_2$, . . . , $112_j$. The summing unit 120 is configured to receive and to sum the outputs of the multiply-accumulate units $110_1$, $110_2$, . . . , $110_j$.

Each of the multiply-accumulate units $110_1$, $110_2$, . . . , $110_j$ is similar to the multiply-accumulate unit 110 of the foregoing multiply-accumulate circuit 100, thus the foregoing description of the multiply-accumulate unit 110 and various embodiments thereof are also applicable thereto, and details are not described herein again. It may be understood that the multiply-accumulate units $110_1$, $110_2$, . . . , $110_j$ may have the same design, or may have different designs.

Compared to the multiply-accumulate circuit 100 with only one multiply-accumulate unit 110, the multiply-accumulate circuit 100' has a plurality of multiply-accumulate units $110_1$, $110_2$, . . . , $110_j$ in parallel, and each multiply-accumulate unit undertakes a portion of the accumulation function, so that each multiply-accumulate unit can be maintained at a proper size, thereby avoiding the difficulty in timing convergence caused by the large circuit scale of the single multiply-accumulate unit, and facilitating to reduce the glitch-caused power consumption and to optimize the circuit speed.

The summing unit 120 may include s stages of compression trees and an adder, the output terminal of each of the multiply-accumulate units $110_1$, $110_2$, . . . , $110_j$ is coupled to a corresponding input terminal of the first-stage of compression tree in the s stages of compression trees, the output terminal of the $i^{th}$-stage of compression tree in the s stages of compression trees is coupled to a corresponding input terminal of the $(i+1)^{th}$-stage of compression tree in the s stages of compression trees, and the output terminal of the $s^{th}$-stage of compression tree in the s stages of compression trees is coupled to a corresponding input terminal of the adder, wherein s is a non-negative integer, and i=1, 2, . . . , s−1. It should be understood that when s=0, it means that the summing unit 120 includes only the adder but not the compression tree. For example, when j is 2, the summing unit 120 may include only the adder. Each stage of compression tree may include one compression tree or a plurality of parallel compression trees. Similar to the above, the compression tree herein may be alternatively implemented as a combination of a full adder and a half adder or a full adder.

In addition, in some embodiments, the summing unit 120 may further include an additional register group. The input terminal of the additional register group is coupled to the output terminal of the adder, and the output terminal of the additional register group is coupled to a corresponding input terminal of the first-stage of compression tree in the s stages of compression trees. It should be understood that when s=0, the summing unit 120 includes only the adder. In this case, the summing unit 120 may further include a second adder and an additional register group, the input terminal of the additional register group is coupled to the output terminal of the second adder, and the output terminal of the additional register group and the output terminal of the adder are coupled to corresponding input terminals of the second adder. Due to the introduction of the additional register group, the summing unit 120 also has the accumulation function, so that the accumulation subcircuit of each of the multiply-accumulate units $110_1$, $110_2$, . . . , $110_j$ does not need to perform the complete accumulation, which reduces the bit width requirement on the register group of the accumulation subcircuit, so that the register in the register group of the accumulation subcircuit can have a relatively small bit number and then have a relatively low area and power consumption.

In the entire operation process of the multiply-accumulate units $110_1$, $110_2$, . . . , $110_j$, the summing unit 120 continues to flip (flip means the circuit signal changing from 0 to 1 or from 1 to 0) to perform the summation operation, which results in relatively high dynamic power consumption of the multiply-accumulate circuit 100'. Thus, in some embodiments, the multiply-accumulate circuit 100' further includes a control element disposed between the output terminal of each of the multiply-accumulate units $110_1$, $110_2$, . . . , $110_j$ and a corresponding input terminal of the summing unit 120, and the control element may be configured to receive the control signal and the output of the corresponding multiply-accumulate unit, and to control, according to the control signal, whether to provide the output of the corresponding multiply-accumulate unit to the summing unit 120 at the output terminal of the control element. For example, the control element may include at least one of: an AND gate, a NAND gate, a multiplexer, or an inverse multiplexer.

The control signal may be configured such that the control element does not provide the output of the corresponding multiply-accumulate unit to the summing unit 120 at the output terminal of the control element before the corresponding multiply-accumulate unit completes each round of accumulation, and may be configured to provide the output of the corresponding multiply-accumulate unit to the summing unit 120 at the output terminal of the control element after the corresponding multiply-accumulate unit completes each round of accumulation and before the next round of accumulation starts. Note that "each round of accumulation" herein refers to the accumulation that is performed from each time the result stored in the register group of each multiply-accumulate unit being cleared to prepare for the accumulation to the next time the result stored in the register group being cleared to prepare for the accumulation, rather than each time the result stored in the register group being updated.

Under the control of the control element, the summing unit 120 does not receive the output of each multiply-accumulate unit before each multiply-accumulate unit completes the current round of accumulation, and thus does not perform the summation operation. In other words, under the control of the control element, the input received by the summing unit 120 is always zero before each multiply-accumulate unit completes the current round of accumulation. After each multiply-accumulate unit completes the current round of accumulation, the summing unit 120 receives and sums the output of each multiply-accumulate unit under the control of the control element. That is, in the entire operation process of the multiply-accumulate units $110_1$, $110_2$, . . . , $110_j$, each multiply-accumulate unit always flips, but the summing unit 120 does not flip. Only after the operations of the multiply-accumulate units $110_1$, $110_2$, . . . , $110_j$ are completed, the summing unit 120 flips for one period for summing. By the isolation of the control element, the flip frequency of the summing unit 120 is much lower than that of the multiply-accumulate units $110_1$, $110_2$, . . . , $110_j$. The multiply-accumulate units $110_1$, $110_2$, . . . , $110_j$ may be considered as the dynamic regions of the multiply-accumulate circuit 100', while the summing unit 120 may be considered as the static region of the multiply-accumulate circuit 100'. By dividing the dynamic region and the static region, the multiply-accumulate circuit 100' implements the reduced power consumption.

For non-limiting illustrative purposes, FIGS. 19 to 22 respectively show example circuit diagrams for implementing the multiply-accumulate circuit 100' of FIG. 18 according to some embodiments of the present disclosure.

Figure 19:
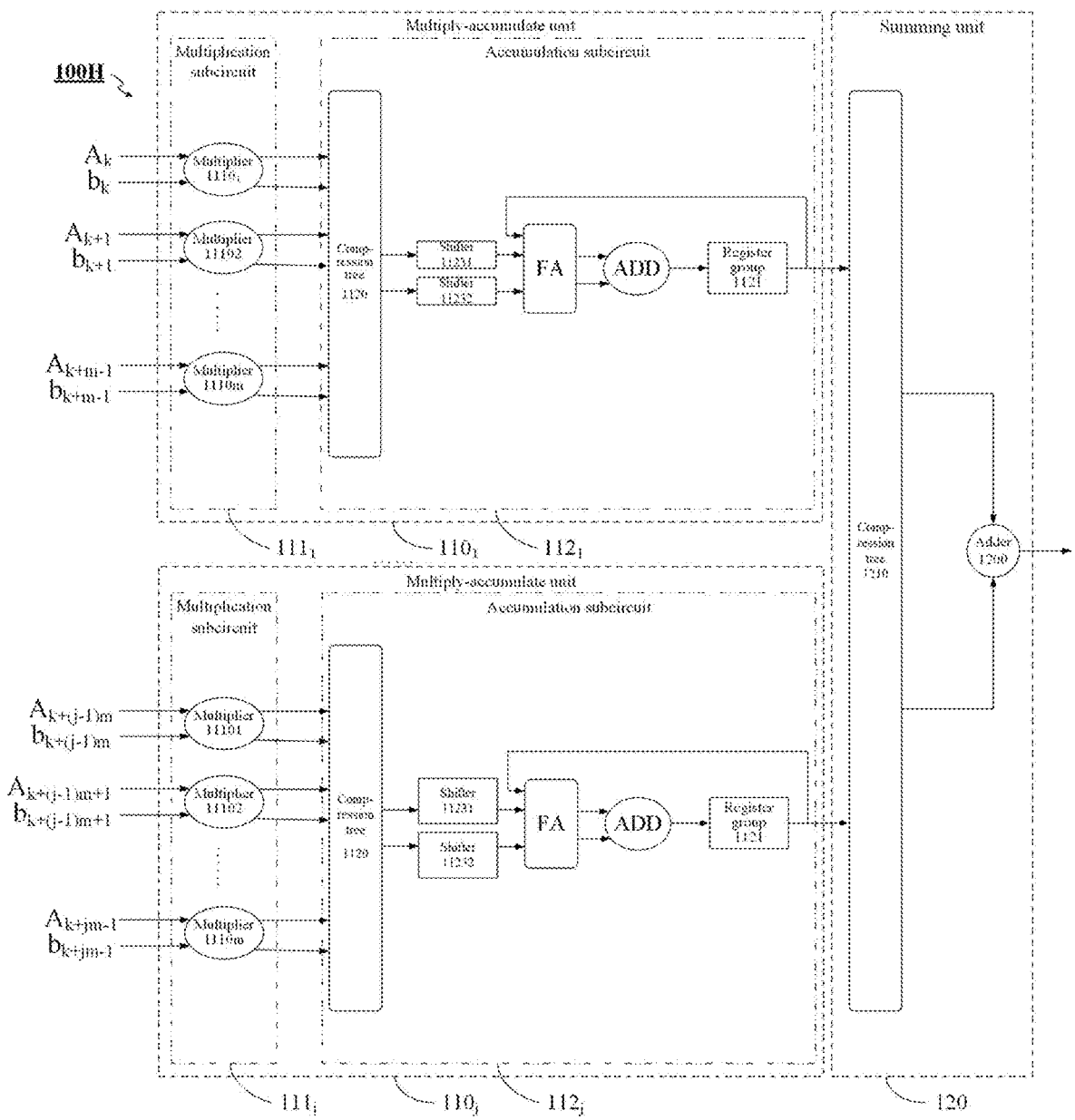
FIGS. 19 to 22 respectively show example circuit diagrams for implementing the multiply-accumulate circuit of FIG. 18 according to some embodiments of the present disclosure.

FIG. 19 shows the multiply-accumulate circuit 100H that differs from the multiply-accumulate circuit 100G of FIG. 17 in that the number of the multiply-accumulate units is changed from 1 to j, and the summing unit 120 is added to sum the outputs from the j multiply-accumulate units $110_1$, . . . , $110_j$. The summing unit 120 includes one stage of compression tree 1210 and an adder 1200. The compression tree 1210 may be omitted when j=2. By the parallel design of the multiply-accumulate units $110_1$, . . . , $110_j$, each multiply-accumulate unit of the multiply-accumulate circuit 100H can implement the multiplication and accumulation of m pairs of numbers in each period. Compared to the (x/m) periods required by the multiply-accumulate circuit 100G of FIG. 17, the multiply-accumulate circuit 100H of FIG. 19 needs only (x/jm+1) periods, and thus has improved the operation efficiency. The number j of the parallel multiply-accumulate units may be flexibly configured according to an actual requirement. In addition, compared to the multiply-accumulate circuit 100G that uses the single accumulation subcircuit to accumulate, the multiply-accumulate circuit 100H uses a plurality of accumulation subcircuits to accumulate, which can avoid the difficulty in timing convergence caused by the large circuit scale of one accumulation subcircuit.

Figure 20:
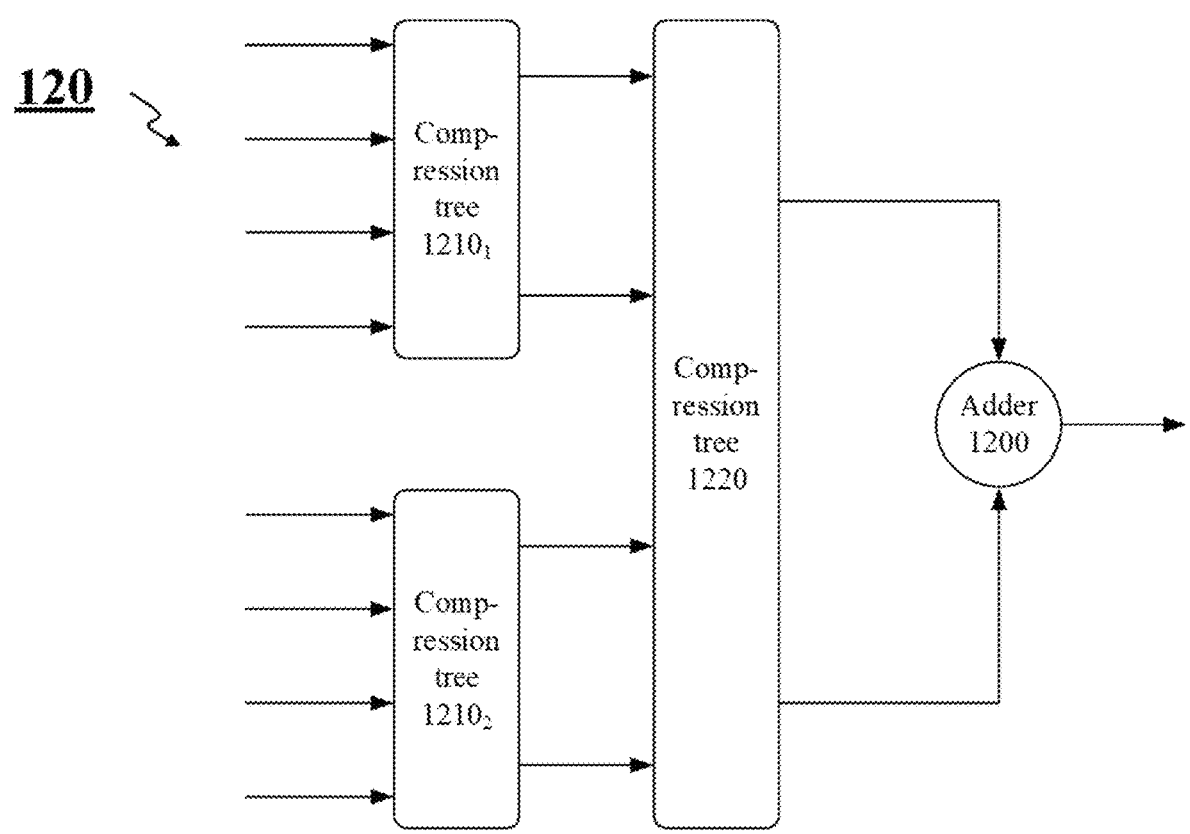

Referring to FIG. 20, which shows that two stages of compression trees are disposed before the adder 1200 in the summing unit 120, wherein the first-stage of compression tree includes two parallel compression trees $1210_1$ and $1210_2$, and the second-stage of compression tree includes one compression tree 1220. The output terminals of the multiply-accumulate units $110_1$, . . . , $110_j$ may be coupled to corresponding input terminals of the first-stage of compression tree $1210_1$ and $1210_2$, the output terminals of the first-stage of compression tree $1210_1$ and $1210_2$ may be coupled to corresponding input terminals of the second-stage of compression tree 1220, the output terminal of the second-stage of compression tree 1220 may be coupled to the adder 1200, and the output terminal of the adder 1200 may provide the output terminal of the summing unit 120 and also provide the output terminal of the multiply-accumulate circuit. FIG. 20 is equivalent to using a combination of three 4:2 compression trees to implement one 8:2 compression tree. The compression tree of the summing unit 120 of FIG. 20 may have a simpler design than that of the compression tree of the summing unit 120 of FIG. 19. From another perspective, when the summing unit 120 of FIG. 20 and the summing unit 120 of FIG. 19 employ a same type of compression tree, the former can accommodate a larger scale of the multiply-accumulate unit, thereby further improving the circuit processing performance.

Figure 21:
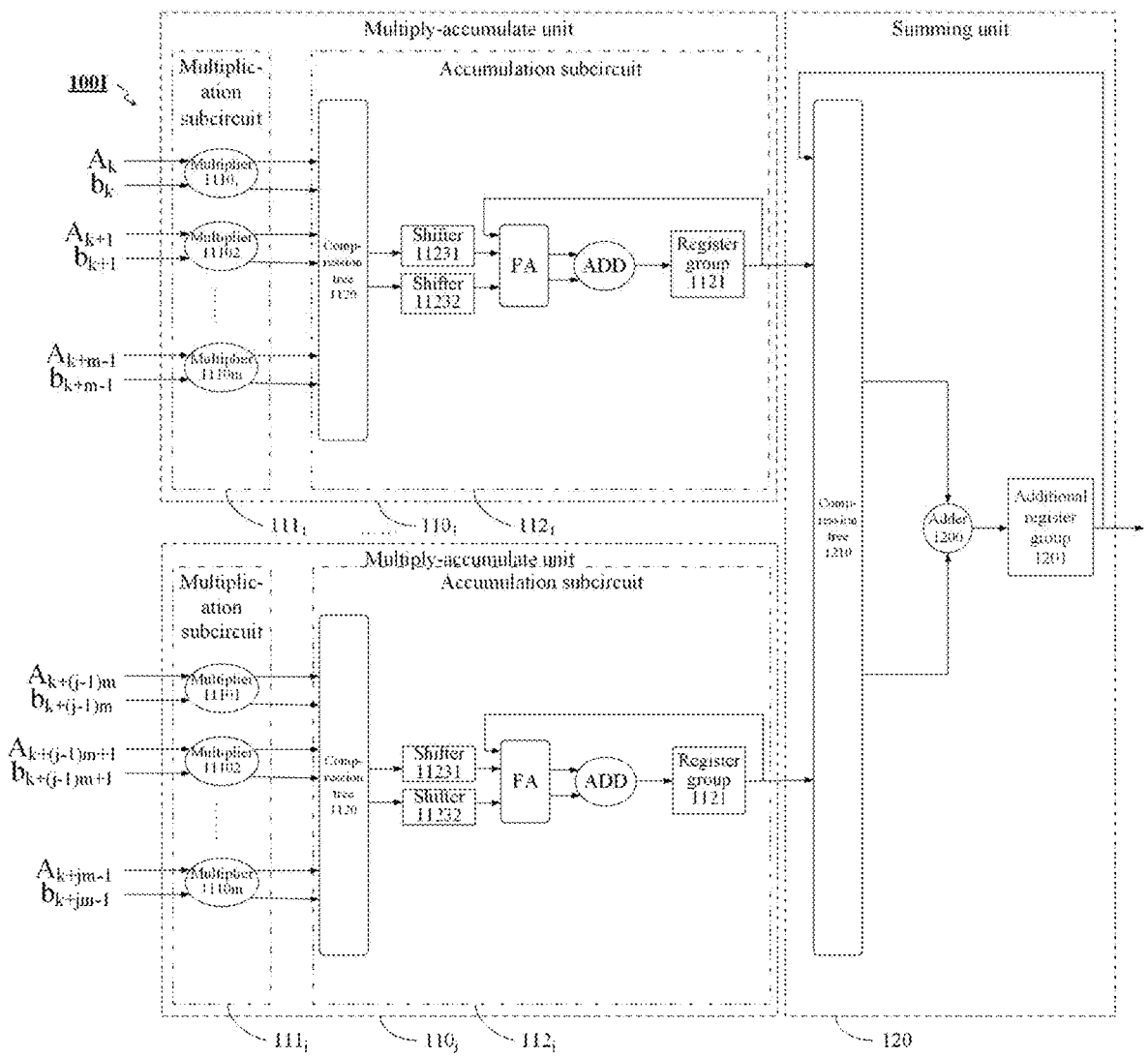

FIG. 21 shows the multiply-accumulate circuit 100I that differs from the multiply-accumulate circuit 100H of FIG. 19 in that the summing unit 120 further includes an additional register group 1201. The input terminal of the additional register group 1201 is coupled to the output terminal of the adder 1200, and the output terminal of the additional register group 1201 is coupled to a corresponding input terminal of the first-stage of compression tree 1210. Due to the introduction of the additional register group 1201, the summing unit 120 also has the accumulation function, so that the accumulation subcircuit of each of the multiply-accumulate units $110_1, \ldots, 110_j$ does not need to perform the complete accumulation, which reduces the bit width requirement on the register group of the accumulation subcircuit, so that the register in the register group of the accumulation subcircuit can have a relatively small bit number and then have a relatively low area and power consumption.

Figure 22:
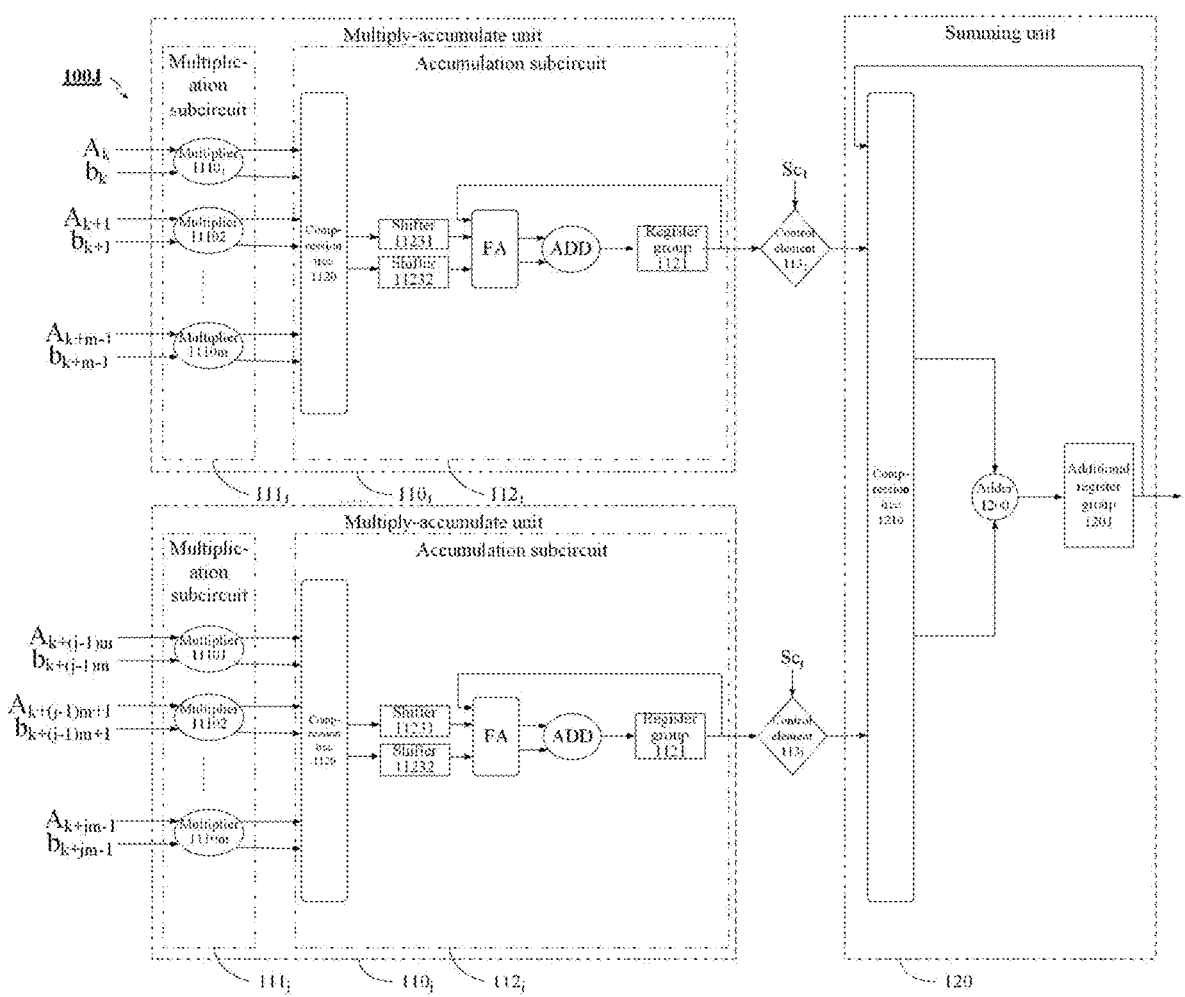

FIG. 22 shows the multiply-accumulate circuit 100J that differs from the multiply-accumulate circuit 100I of FIG. 21 in that the control elements $113_1, \ldots, 113_j$ are further disposed between the output terminals of the multiply-accumulate units $110_1, \ldots, 110_j$ and corresponding input terminals of the summing unit 120. The control elements $113_1, \ldots, 113_j$ receive the outputs of the corresponding multiply-accumulate units $110_1, \ldots, 110_j$ and the control signals $Sc_1, \ldots, Sc_j$ as the inputs and are configured to control, according to the control signals $Sc_1, \ldots, Sc_j$, whether to provide the outputs of the corresponding multiply-accumulate units $110_1, \ldots, 110_j$ to the summing unit 120 at the output terminals of the control elements $113_1, \ldots, 113_j$. Each of the control elements $113_1, \ldots, 113_j$ may include at least one of: an AND gate, a NAND gate, a multiplexer, or an inverse multiplexer. For example, each of the control elements $113_1, \ldots, 113_j$ may include an AND gate group or a NAND gate group or a multiplexer group or an inverse multiplexer group. The number of elements in the AND gate group or in the NAND gate group or in the multiplexer group or in the inverse multiplexer group may depend on the data bit width. For example, when the control elements $113_1, \ldots, 113_j$ each include the AND gate group, the outputs of the register groups of the corresponding multiply-accumulate units may not be provided at the output terminals of the control elements (alternatively, 0 may be output at the output terminals of the control elements) in a case in which the control signals $Sc_1, \ldots, Sc_j$ are 0, while the outputs of the register groups of the corresponding multiply-accumulate units are provided at the output terminals of the control elements in a case in which the control signals $Sc_1, \ldots, Sc_j$ are 1. When the control elements $113_1, \ldots, 113_j$ each include the multiplexer group, the control signals $Sc_1, \ldots, Sc_j$ may serve as the selection signals, and 0 may serve as the first inputs, while the outputs of the register groups of the corresponding multiply-accumulate units may serve as the second inputs, thereby the multiplexer groups may provide the first inputs as 0 at the output terminals of the multiplexer groups (that is, the second inputs as the outputs of the register groups of the corresponding multiply-accumulate units are not provided at the output terminals of the multiplexer groups) in a case in which the control signals $Sc_1, \ldots, Sc_j=0$; while provide the second inputs as the outputs of the register groups of the corresponding multiply-accumulate units at the output terminals of the multiplexer groups in a case in which the control signals $Sc_1, \ldots, Sc_j=1$. A case in which the control elements $113_1, \ldots, 113_j$ each include the NAND gate group and a case in which the control elements $113_1, \ldots, 113_j$ each include the inverse multiplexer group are respectively similar to the case in which the control elements $113_1, \ldots, 113_j$ each include the AND gate group and the case in which the control elements $113_1, \ldots, 113_j$ each include the multiplexer group, but an inverted output is provided, which may be corrected within the summing unit 120 by adjusting the configuration of the summing unit 120 (for example, adding a NOT gate, an inverter, or the like).

For example, assuming that the multiply-accumulate circuit 100J is to implement the multiplication and accumulation of 1024 pairs of numbers $(A_1 \cdot b_1 + A_2 \cdot b_2 + \ldots A_{1024} \cdot b_{1024})$, the multiply-accumulate circuit 100J includes four multiply-accumulate units (j=4), and the multiplication subcircuit of each multiply-accumulate unit includes four multipliers (m=4), then a typical multiply-accumulate operation process may be performed as follows: 16 multipliers perform the calculation in parallel to output 16 multiplication operation results in each period; and four accumulation subcircuits perform the accumulation in parallel, and the register group in each accumulation subcircuit is configured to output the stored result and to clear every eight periods (meaning that one round of accumulation includes eight periods); therefore, the output provided by each multiply-accumulate unit to the summing unit each time under the control of a corresponding control element includes the multiplication and accumulation result of 32 pairs of numbers, that is, the summing unit receives the multiplication and accumulation results of 128 pairs of number every eight periods. To complete the multiplication and accumulation of 1024 pairs of numbers, the compression tree, the adder, and the additional register group in the summing unit need to flip only 8 times, thereby implementing the reduced power consumption.

As mentioned above, since the first number $a_k$ that is not previously known may be processed as an unsigned number $A_k$, the multipliers of the multiply-accumulate circuits 100 and 100' only need to support the multiplication operation between an unsigned number $A_k$ and a previously known number $b_k$ (regardless of whether it is a signed or unsigned number). The operation process of the multiplication operation mul of an unsigned number $A_k$ (assuming the bit width of z) and a previously known number $b_k$ (assuming the bit width of w) may be unified as follows by the following mathematical derivations.

When $b_k$ is an unsigned number, $$\text{mul} = A_k \cdot b_k$$
$$\text{mul} = A_k \cdot \left(b_{k(w-1)} \cdot 2^{w-1} + b_{k[(w-2):0]}\right)$$
$$\text{mul} = A_k \cdot b_{k(w-1)} \cdot 2^{w-1} + A_k \cdot b_{k[(w-2):0]}$$

wherein $b_{k(w-1)}$ is the highest bit of $b_k$, and $b_{k[(w-2):0]}$ are other bits of $b_k$ other than the highest bit $b_{k(w-1)}$. "$\cdot 2^{w-1}$" is the shift operation, meaning shift to left by (w−1) bits.

When $b_k$ is a signed number, $$\text{mul} = A_k \cdot b_k$$
$$\text{mul} = A_k \cdot \left(-b_{k(w-1)} \cdot 2^{w-1} + b_{k[(w-2):0]}\right)$$

-continued $$\text{mul} = A_k \cdot (-b_{k(w-1)} \cdot 2^{w-1}) + A_k \cdot b_{k[(w-2):0]}$$

$$\text{mul} = [\sim(A_k \cdot b_{k(w-1)})] \cdot 2^{w-1} + A_k \cdot b_{k[(w-2):0]} + (1-2^z) \cdot 2^{w-1}$$

wherein $\sim$ is the bitwise negation operator. $(1-2^z) \cdot 2^{w-1}$ can be extracted as the constant term. Therefore, the operation process of an unsigned number $A_k$ and a previously known unsigned number $b_k$ is similar to that of an unsigned number $A_k$ and the previously known signed number $b_k$, which are the same in terms of obtaining the partial product $(A_k \cdot b_{k[(w-2):0]})$ of $A_k$ and the other bits $b_{k[(w-2):0]}$ except for the highest bit $b_{k(w-1)}$. The difference is in terms of obtaining the partial product of $A_k$ and the highest bit $b_{k(w-1)]}$ of $b_k$, because for a signed number $b_k$, the highest bit being the sign bit instead of representing the value.

According to the foregoing operation principle, the present disclosure provides the multiplier, which may be used to perform the multiplication operation of the first multiplicator and the second multiplicator, wherein the first multiplicator is an unsigned number, and the second multiplicator is a previously known unsigned or signed number. Such a multiplier may include the partial product generation circuit and the partial product summing circuit. The partial product generation circuit is configured to receive the first multiplicator and the second multiplicator and to output the partial product thereof. The input terminal of the partial product summing circuit is coupled to the output terminal of the partial product generation circuit. The partial product summing circuit is configured to receive and to sum the partial product output from the partial product generation circuit. In particular, the partial product generation circuit may include the first partial product generation unit used to output the partial product of the highest bit of the second multiplicator and the first multiplicator. The first partial product generation unit is configured to: in a case in which the second multiplicator is an unsigned number, output the partial product of the highest bit of the second multiplicator and the first multiplicator; and in a case in which the second multiplicator is a signed number, output the negation result of the partial product of the highest bit of the second multiplicator and the first multiplicator. For example, the first partial product generation unit may be configured to receive the sign flag bit indicating whether the second multiplicator is an unsigned or signed number; in a case in which the sign flag bit indicates that the second multiplicator is an unsigned number, to output the partial product of the highest bit of the second multiplicator and the first multiplicator; and in a case in which the sign flag bit indicates that the second multiplicator is a signed number, to output the negation result of the partial product of the highest bit of the second multiplicator and the first multiplicator. The first partial product generation unit may determine, in another manner, whether the second multiplicator is an unsigned or signed number.

Figure 23:
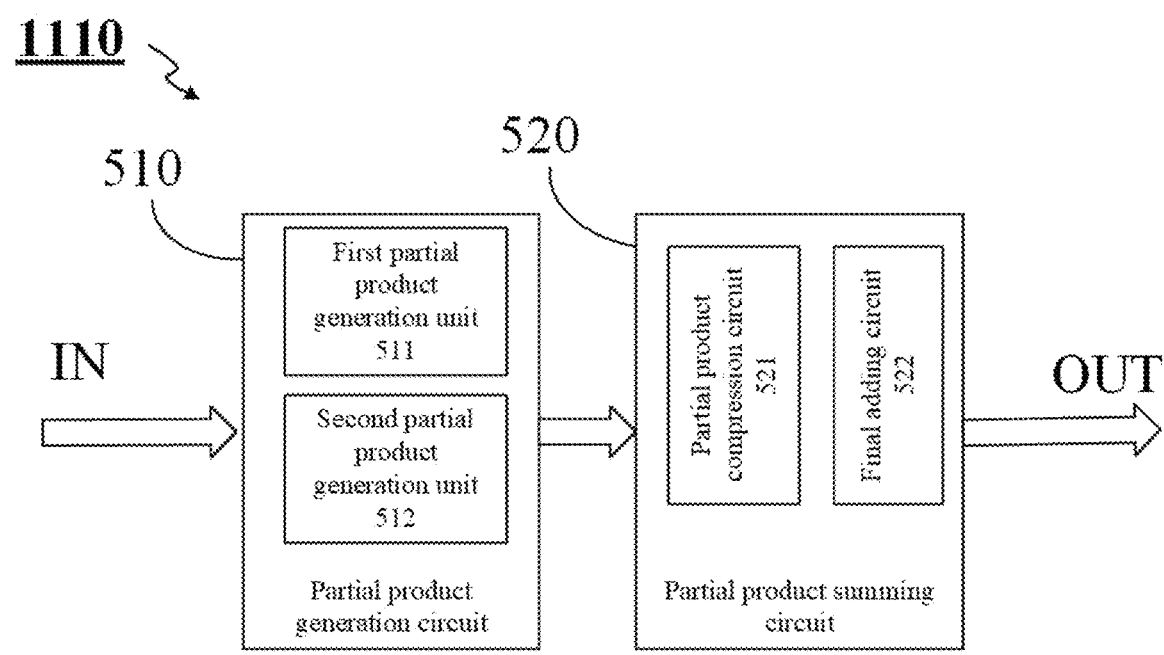
FIG. 23 shows a schematic block diagram of a multiplier according to some embodiments of the present disclosure.

FIG. 23 shows a multiplier 1110 according to some embodiments of the present disclosure. As shown in FIG. 23, the multiplier 1110 includes the partial product generation circuit 510 and the partial product summing circuit 520. The input terminal of the partial product generation circuit 510 may provide the input terminal IN of the multiplier 1110. The input terminal of the partial product summing circuit 520 is coupled to the output terminal of the partial product generation circuit 510. The output terminal of the partial product summing circuit 520 may provide the output terminal OUT of the multiplier 1110.

The partial product generation circuit 510 is configured to receive the first multiplicator as an unsigned number and the previously known second multiplicator and to output the partial product thereof. The partial product generation circuit 510 may include the first partial product generation unit 511 used to output the partial product of the highest bit of the second multiplicator and the first multiplicator. The first partial product generation unit 511 may receive the highest bit of the second multiplicator and the first multiplicator and receive the sign flag bit indicating whether the second multiplicator is an unsigned or signed number. The first partial product generation unit 511 is configured to output the partial product of the highest bit of the second multiplicator and the first multiplicator in a case in which the received sign flag bit indicates that the second multiplicator is an unsigned number. The first partial product generation unit 511 is further configured to output the negation result of the partial product of the highest bit of the second multiplicator and the first multiplicator in a case in which the received sign flag bit indicates that the second multiplicator is a signed number.

In some embodiments, the first partial product generation unit 511 includes: an AND gate group, configured to receive the highest bit of the second multiplicator and the first multiplicator and to perform an AND operation thereon; and an exclusive-OR gate group, configured to receive the AND operation result of the AND gate group and the sign flag bit indicating whether the second multiplicator is an unsigned or signed number and to perform an exclusive-OR operation thereon. The exclusive-OR operation result of the exclusive-OR gate group is provided as the output of the first partial product generation unit 511.

In some embodiments, the first partial product generation unit 511 includes: a NAND gate group, configured to receive the highest bit of the second multiplicator and the first multiplicator and to perform a NAND operation thereon; and an exclusive-OR gate group, configured to receive the NAND operation result of the NAND gate group and the sign flag bit indicating whether the second multiplicator is an unsigned or signed number and to perform an exclusive-OR operation thereon. The exclusive-OR operation result of the exclusive-OR gate group is provided as the output of the first partial product generation unit 511.

In some embodiments, the first partial product generation unit 511 includes: an exclusive-OR gate, configured to receive the highest bit of the second multiplicator and the sign flag bit indicating whether the second multiplicator is an unsigned or signed number and to perform an exclusive-OR operation thereon; and a multiplexer group, wherein each multiplexer in the multiplexer group is configured to receive the sign flag bit as the first input, to receive the exclusive-OR operation result of the exclusive-OR gate as the second input, to receive a corresponding bit of the first multiplicator as the selection signal, and to output the first input or the second input according to the selection signal. The output of the multiplexer group is provided as the output of the first partial product generation unit 511.

In some embodiments, the first partial product generation unit 511 includes: an exclusive-OR gate, configured to receive the highest bit of the second multiplicator and the sign flag bit indicating whether the second multiplicator is an unsigned or signed number and to perform an exclusive-OR operation thereon; and an inverse multiplexer group, wherein each inverse multiplexer in the inverse multiplexer group is configured to receive the sign flag bit as the first input, to receive the exclusive-OR operation result of the exclusive-OR gate as the second input, to receive a corresponding bit of the first multiplicator as the selection signal, and to output the first input or the second input according to the selection signal. The output of the inverse multiplexer group is provided as the output of the first partial product generation unit 511.

In some embodiments, the first partial product generation unit 511 includes: an AND gate group, configured to receive the highest bit of the second multiplicator and the first multiplicator and to perform an AND operation thereon; and a multiplexer group, configured to receive the AND operation result of the AND gate group as the first input, to receive the negation result of the AND operation result of the AND gate group as the second input, to receive the sign flag bit indicating whether the second multiplicator is an unsigned or signed number as the selection signal, and to output the first input or the second input according to the selection signal, wherein the output of the multiplexer group is provided as the output of the first partial product generation unit 511. The NOT gate group may be used to receive the AND operation result of the AND gate group and to perform a NOT operation thereon to obtain the negation result of the AND operation result of the AND gate group. In addition, the AND gate group may be replaced with the NAND gate group. Additionally or alternatively, the multiplexer group may be replaced with the inverse multiplexer group.

The partial product generation circuit 510 may further include a second partial product generation unit 512 used to output the partial product of the other bits of the second multiplicator other than the highest bit and the first multiplicator.

In some embodiments, the second partial product generation unit 512 may be used to output the partial product of a modified second multiplicator ($b_{k[(w-2):0]}$) and the first multiplicator ($A_k$), wherein the modified second multiplicator ($b_{k[(w-2):0]}$) is obtained by removing the highest bit ($b_{k(w-1)}$) of the second multiplicator ($b_k$) and is an unsigned number. In such an embodiment, the second partial product generation unit 512 may include the multiplier used to perform the multiplication operation of an unsigned number and an unsigned number.

Instead of taking $b_{k[(w-2):0]}$ as a whole to generate the partial product, $b_{k[(w-2):0]}$ may be split into a plurality of portions to respectively generate the partial products, and each portion may include one or more bits of $b_{k[(w-2):0]}$. For example, the second partial product generation unit 512 may include a plurality of second partial product generation units, and each second partial product generation unit is used to output a partial product of a corresponding bit of the second multiplicator ($b_k$) other than the highest bit ($b_{k(w-1)}$) and the first multiplicator ($A_k$). In some embodiments, each second partial product generation unit may include an AND gate group, configured to receive the corresponding bit of the second multiplicator other than the highest bit and the first multiplicator and to perform an AND operation thereon. The AND operation result of the AND gate group is provided as the output of each second partial product generation unit. In some other embodiments, each second partial product generation unit may include a NAND gate group, configured to receive the corresponding bit of the second multiplicator other than the highest bit and the first multiplicator and to perform a NAND operation thereon. The NAND operation result of the NAND gate group is provided as the output of each second partial product generation unit.

With continued reference to FIG. 23, the partial product summing circuit 520 is configured to receive and to sum the partial product output from the partial product generation circuit 510. In a case in which the multiplier 1110 is configured to have two output terminals, the partial product summing circuit 520 may include a partial product compression circuit 521. The input terminal of the partial product compression circuit 521 is coupled to the output terminal of the partial product generation circuit 510. The partial product compression circuit 521 is configured to receive the partial product output by the partial product generation circuit 510 and to perform compression summing thereon to output a sum bit and a carry bit of the compression summing result of the partial product. In a case in which the multiplier 1110 is configured to have a single output terminal, the partial product summing circuit 520 may further include a final adding circuit 522 in addition to the partial product compression circuit 521. The input terminal of the final adding circuit 522 is coupled to the output terminal of the partial product compression circuit 521. The final adding circuit 522 is configured to receive and to sum the sum bit and the carry bit output by the partial product compression circuit 521.

For non-limiting illustrative purposes, FIGS. 24 to 27 respectively show example circuit diagrams for implementing the multiplier 1110 of FIG. 23 according to some embodiments of the present disclosure.

Figure 24:
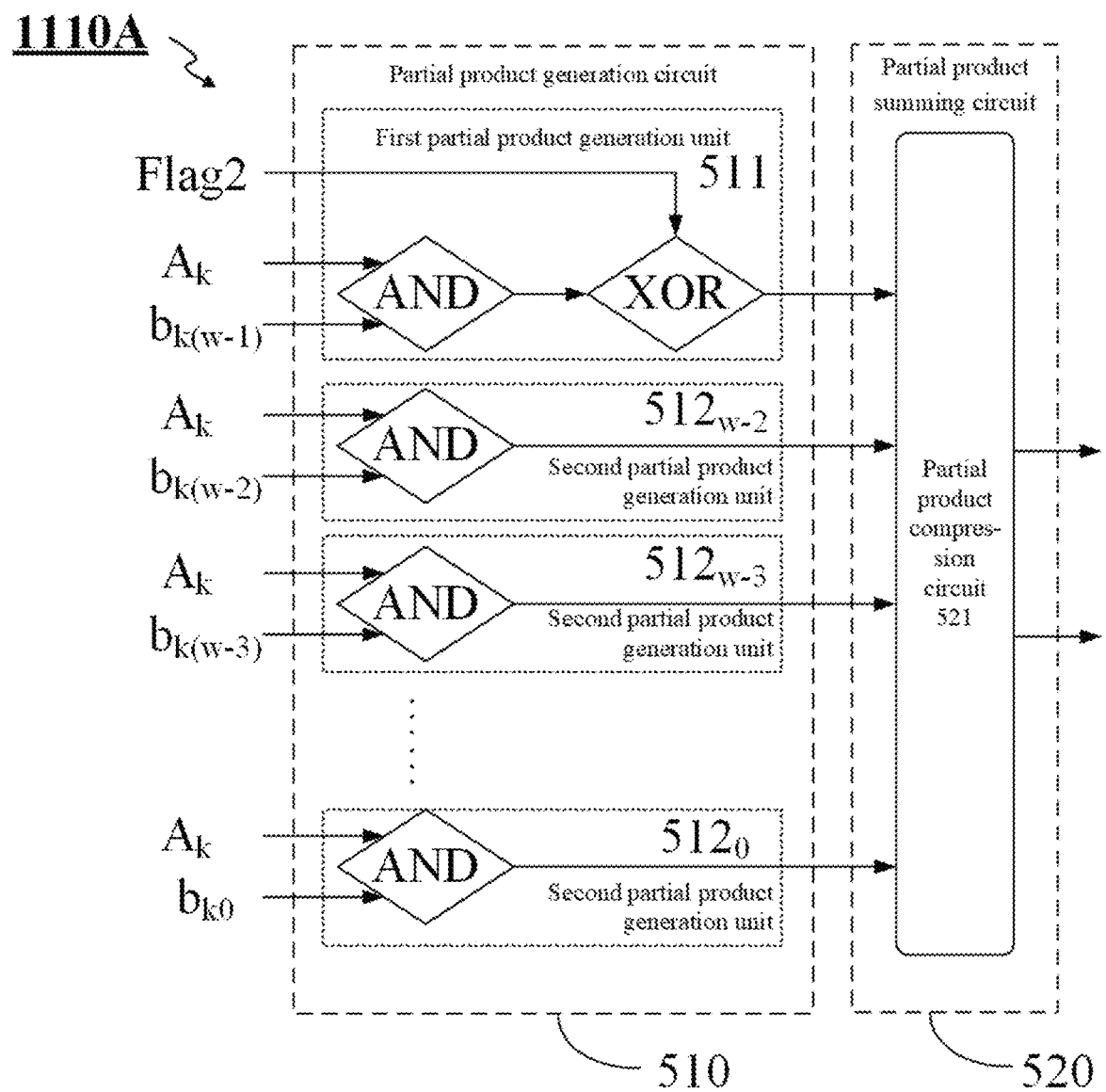
FIGS. 24 to 27 respectively show example circuit diagrams for implementing the multiplier of FIG. 23 according to some embodiments of the present disclosure.

As shown in FIG. 24, the multiplier 1110A has two output terminals and includes the partial product generation circuit 510 and the partial product summing circuit 520. The partial product generation circuit 510 includes the first partial product generation unit 511 and a plurality of second partial product generation units $512_0, \ldots, 512_{w-3}, 512_{w-2}$. The first partial product generation unit 511 includes the AND gate group AND and the exclusive-OR gate group XOR, wherein the AND gate group AND receives the first multiplicator $A_k$ and the highest bit $b_{k(w-1)}$ of the second multiplicator $b_k$ and performs an AND operation thereon, and the exclusive-OR gate group XOR receives the AND operation result of the AND gate group AND and the sign flag bit Flag2 indicating whether the second multiplicator is an unsigned or signed number, and performs an exclusive-OR operation thereon. The exclusive-OR operation result of the exclusive-OR gate group XOR is provided as the output of the first partial product generation unit 511. Each of the second partial product generation units $512_0, \ldots, 512_{w-3}, 512_{w-2}$ includes the AND gate group AND, the AND gate group AND receives the first multiplicator $A_k$ and a corresponding one of $b_{k0}, \ldots, b_{k(w-3)}, b_{k(w-2)}$ of the second multiplicator $b_k$, and performs an AND operation thereon, and the AND operation result is provided as the output of the second partial product generation unit. The partial product summing circuit 520 may include the compression tree as the partial product compression circuit 521. The output terminals of the first partial product generation unit 511 and the plurality of second partial product generation units $512_0, \ldots, 512_{w-3}, 512_{w-2}$ are respectively coupled to corresponding input terminals of the partial product compression circuit 521, and two output terminals of the partial product compression circuit 521 provide two output terminals of the multiplier 1110A. In FIG. 24, the partial product compression circuit 521 is shown as a single w:2 compression tree, and may alternatively use a combination of a plurality of compression trees (for example, cascading of a plurality of stages of compression trees, each stage of compression tree may include one compression tree or a plurality of parallel compression trees), or may be implemented alternatively as a combination of a full adder and a half adder or a full adder.

Figure 25:
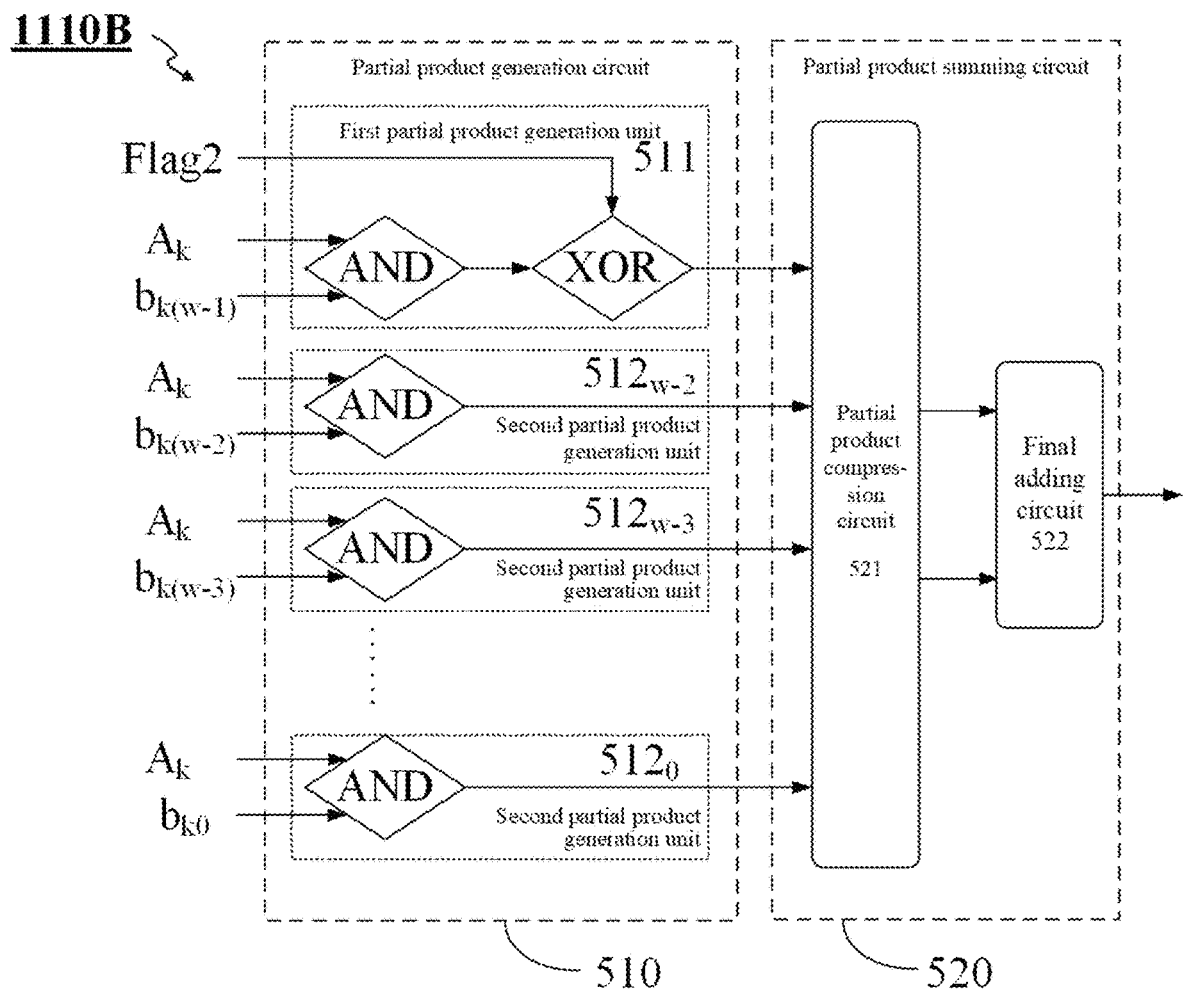

FIG. 25 shows the multiplier 1110B that differs from the multiplier 1110A of FIG. 24 in that the partial product summing circuit 520 further includes the adder as the final adding circuit 522, so that the multiplier 1110B has a single output terminal.

Figure 26:
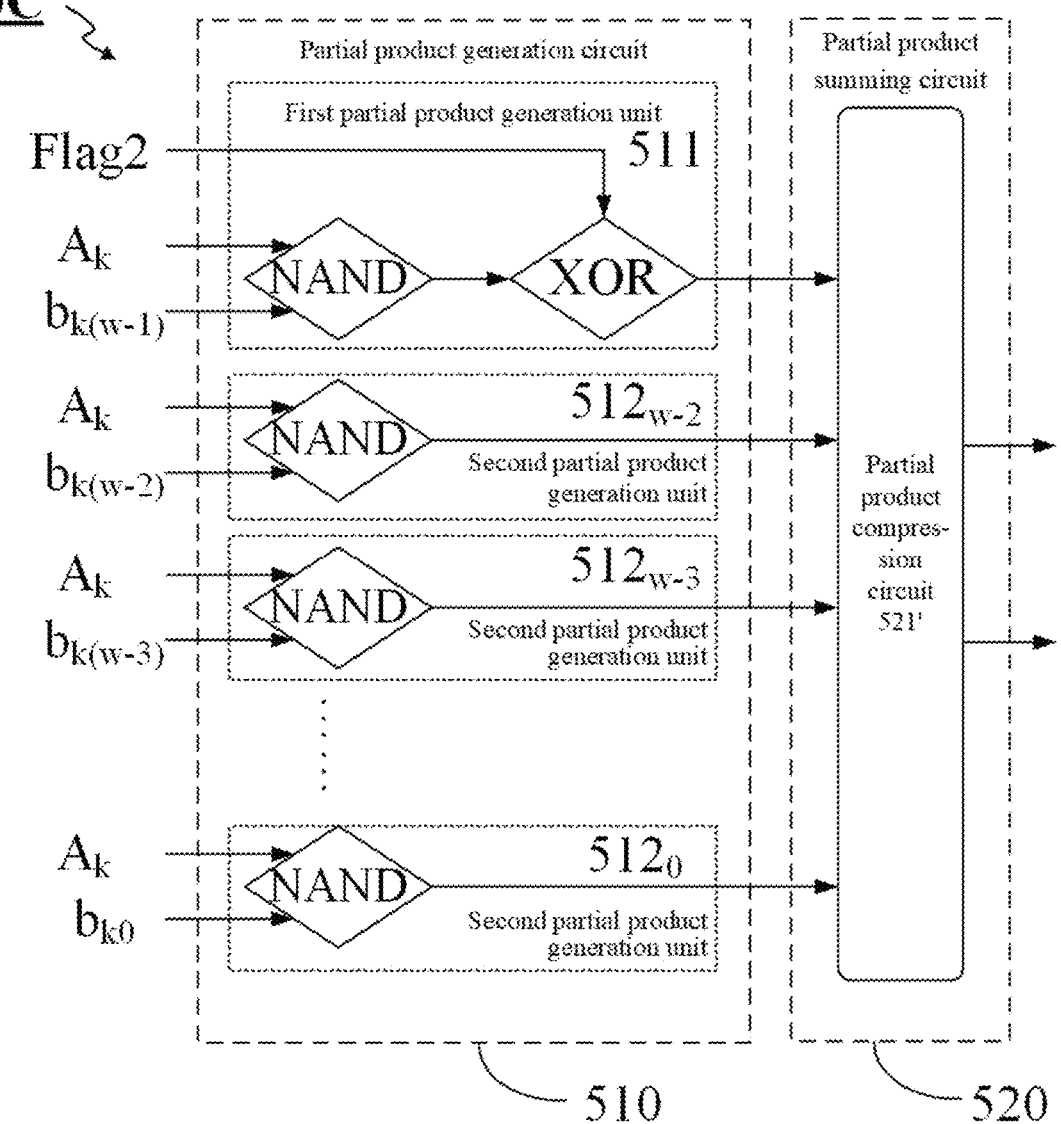

FIG. 26 shows the multiplier 1110C that differs from the multiplier 1110A of FIG. 24 in that the AND gate group AND in the partial product generation circuit 510 is replaced with the NAND gate group NAND. This causes the output of the partial product generation circuit 510 of the multiplier 1110C to be inverted with respect to the output of the partial product generation circuit 510 of the multiplier 1110A. Correspondingly, the partial product compression circuit 521' of the multiplier 1110C needs to be adjusted correspondingly compared to the partial product compression circuit 521 of the multiplier 1110A, to internally correct the inverted output of the partial product generation circuit 510 of the multiplier 1110C. This adjustment is implemented, for example, but not limited to, by incorporating a NOT gate or an inverter into the partial product compression circuit 521'.

Figure 27:
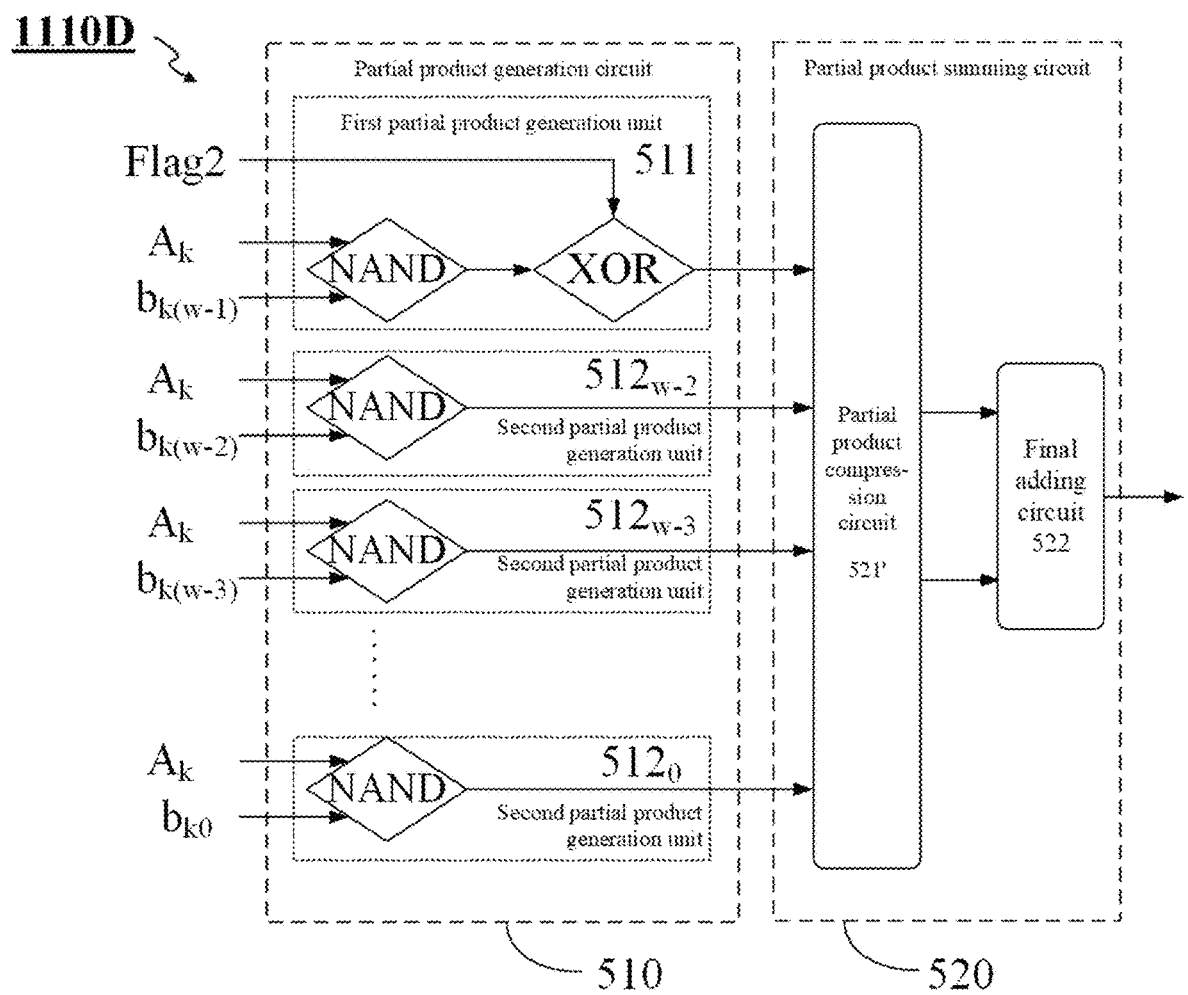

FIG. 27 shows the multiplier 1110D that differs from the multiplier 1110C of FIG. 26 in that the partial product summing circuit 520 further includes an adder as the final adding circuit 522, so that the multiplier 1110D has a single output terminal.

Figure 28:
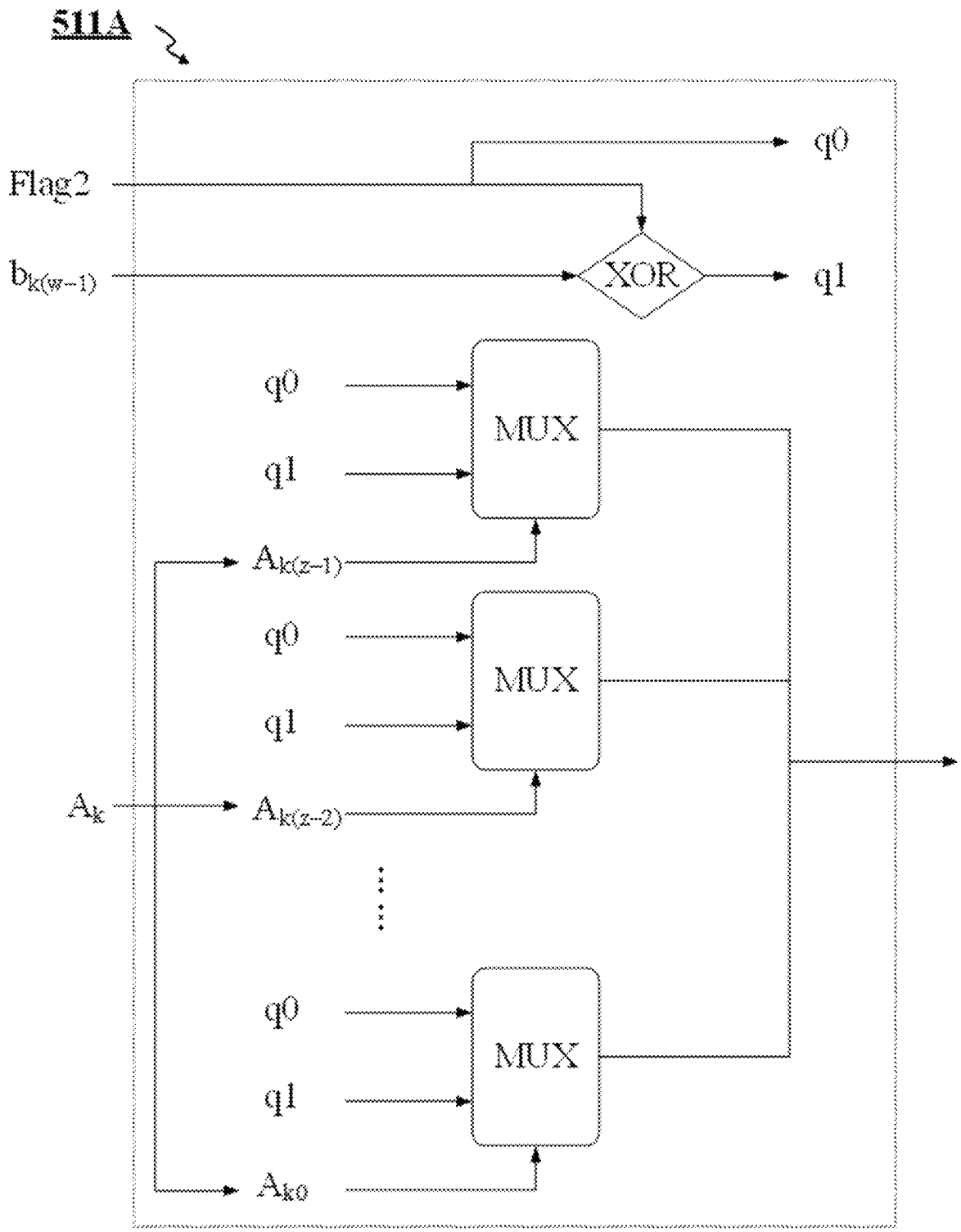
FIGS. 28 to 30 respectively show example circuit diagrams of first partial product generation units for implementing the multiplier of FIG. 23 according to some embodiments of the present disclosure.
Figure 29:
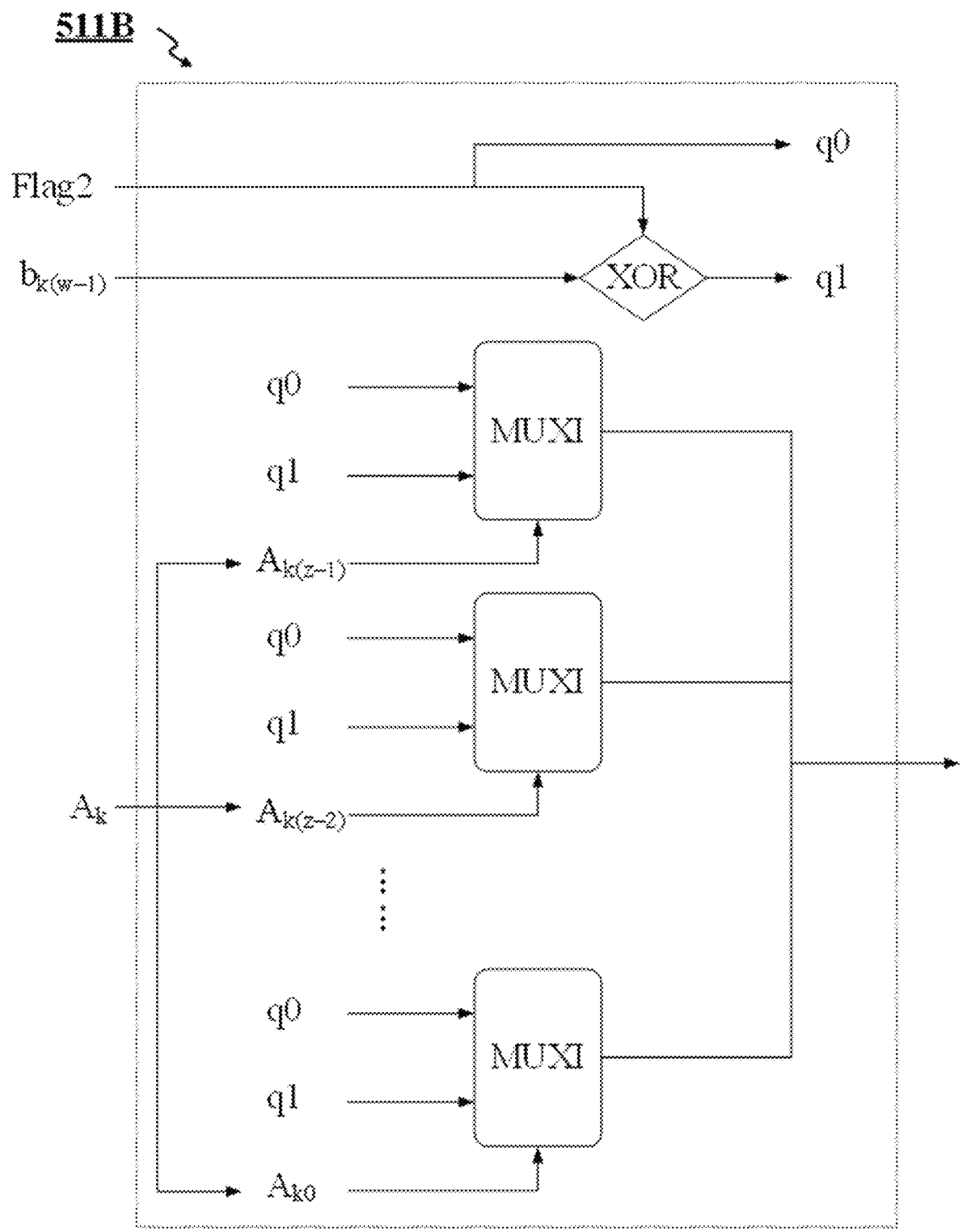
Figure 30:
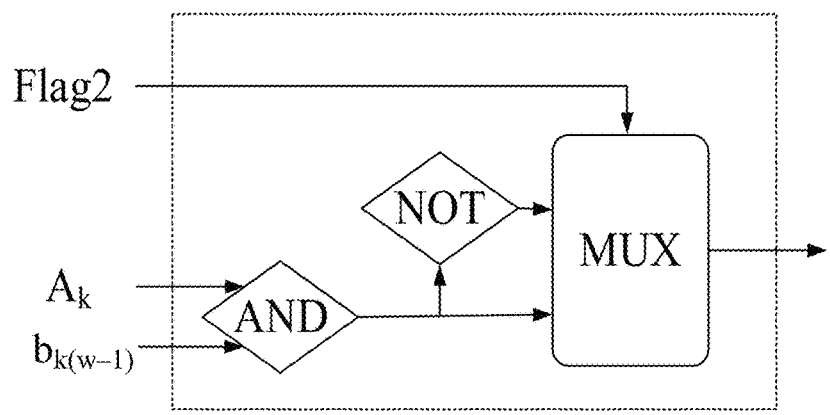

For non-limiting illustrative purposes, FIGS. 28 to 30 respectively show example circuit diagrams for implementing the first partial product generation unit 511 of the multiplier 1110 of FIG. 23 according to some embodiments of the present disclosure.

As shown in FIG. 28, the first partial product generation unit 511A includes an exclusive-OR gate, configured to receive the highest bit $b_{k(w-1)}$ of the second multiplicator $b_k$ and the sign flag bit Flag2 indicating whether the second multiplicator is an unsigned or signed number and to perform an exclusive-OR operation thereon. The first partial product generation unit 511A further includes a multiplexer group MUX. Each multiplexer MUX is configured to receive the sign flag bit Flag2 as the first input q0, to receive the exclusive-OR operation result of the exclusive-OR gate XOR as the second input q1, to receive a corresponding bit ($A_{k0}$, ..., $A_{k(z-2)}$, $A_{k(z-1)}$) of the first multiplicator $A_k$ as the selection signal, and to output the first input q0 or the second input q1 according to the selection signal. Specifically, when the selection signal is 0, the multiplexer MUX outputs the first input q0, and when the selection signal is 1, the multiplexer MUX outputs the second input q1. The output of the multiplexer group MUX is provided as the output of the first partial product generation unit 511A. The first partial product generation unit 511A of FIG. 28 may have fewer logical gates than the first partial product generation units 511 of FIGS. 24 and 25.

FIG. 29 shows the first partial product generation unit 511B that differs from the first partial product generation unit 511A of FIG. 28 in that the multiplexer group MUX is replaced with an inverse multiplexer group MUXI, which causes the output of the first partial product generation unit 511B to be inverted with respect to that of the first partial product generation unit 511A. Correspondingly, the partial product compression circuit 521 of the multiplier 1110 also needs to be adjusted correspondingly to internally correct the inverted output of the first partial product generation unit 511B. This adjustment is implemented, for example, but not limited to, by incorporating a NOT gate or an inverter into the partial product compression circuit 521. The first partial product generation unit 511B of FIG. 29 may have fewer logical gates than the first partial product generation units 511 of FIGS. 26 and 27.

FIG. 30 shows the first partial product generation unit 511C, including an AND gate group AND, a NOT gate group NOT, and a multiplexer group MUX. The AND gate group AND is configured to receive the highest bit $b_{k(w-1)}$ of the second multiplicator $b_k$ and the first multiplicator $A_k$ and to perform an AND operation thereon. The NOT gate group NOT is configured to receive the AND operation result of the AND gate group AND and to perform a NOT operation (negation) thereon. The multiplexer group MUX is configured to receive the AND operation result of the AND gate group AND as the first input, to receive the NOT operation result of the NOT gate group as the second input, to receive the sign flag bit Flag2 indicating whether the second multiplicator $b_k$ is an unsigned or signed number as the selection signal, and to output the first input or the second input according to the selection signal. The output of the multiplexer group MUX is provided as the output of the first partial product generation unit 511. Similar to the foregoing, the AND gate group may be replaced with the NAND gate group. Additionally or alternatively, the multiplexer group may be replaced with the inverse multiplexer group. Correspondingly, the partial product compression circuit 521 of the multiplier 1110 may be adjusted where appropriate.

Figure 31:
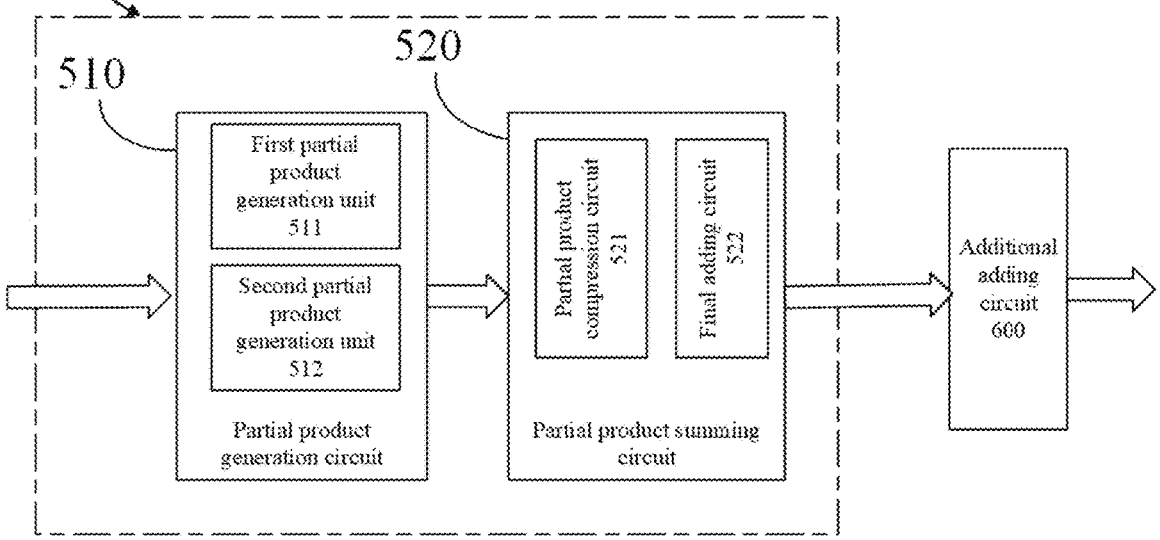
FIG. 31 shows a schematic block diagram of an operational circuit including the multiplier of FIG. 23 and an additional adding circuit according to some embodiments of the present disclosure.

In addition, for the extracted constant term $(1-2^z) \cdot 2^{w-1}$, in some embodiments, with reference to FIG. 31, the output terminal of the partial product summing circuit 520 of the multiplier 1110 is coupled to the input terminal of the additional adding circuit 600, and the additional adding circuit 600 may be configured to add the output of the partial product summing circuit 520 and the constant in a case in which the second multiplicator $b_k$ is a signed number, wherein the constant is $(1-2^z) \cdot 2^{w-1}$, and z is the bit width of the first multiplicator $A_k$, w is the bit width of the second multiplicator $b_k$. In some embodiments, the multiplier 1110 may further include the additional adding circuit 600. In some other embodiments, the additional adding circuit 600 may not be used, and the constant term $(1-2^z) \cdot 2^{w-1}$ may be processed together with the previously mentioned extracted constant term $(-2^{z-1} b_k)$. For example, in some embodiments, the output processing circuit 300 as shown in FIG. 5 may be configured to perform at least one of: subtracting the first constant from the output of the accumulation subcircuit 112, wherein the first constant is the sum of $(2^{z-1} b_k)$, $(2^{z-1} b_k)$ is the second number $b_k$ after being shifted to left by $(z-1)$ bits, and the second numbers $b_k$ in the sum are all the second numbers of the plurality of pairs of first numbers $a_k$ and second numbers $b_k$ that are paired with the first numbers $a_k$ as signed numbers, wherein z is the bit width of the first number $a_k$; or adding the output of the accumulation subcircuit 112 and the second constant, wherein the second constant is $(1-2^z) \cdot 2^{w-1} \cdot y$, z is the bit width of the first multiplicator $A_k$, w is the bit width of the second multiplicator $b_k$, and y is the number of the second multiplicators $b_k$ as signed numbers obtained from all the second numbers $b_k$ of the plurality of pairs of first numbers $a_k$ and second numbers $b_k$. In some cases, no dedicated output processing circuit 300 or additional adding circuit 600 is required to be provided to process these constant terms $(1-2^z) \cdot 2^{w-1}$. For example, in the convolution calculation unit of the neural network processor, in addition to performing the multiply-accumulate operation on the activated data and the weight data, the result of the multiply-accumulate operation needs to be added to a bias term. In the convolution calculation unit, a special hardware is responsible for the addition of the bias term itself, thus the foregoing constant terms $(1-2^z)$ $\cdot 2^{w-1}$ and $(-2^{z-1}b_k)$ may be integrated with the bias term in advance without paying the additional hardware cost for processing.

In another aspect, the present disclosure further provides a processor, which may include the multiplier according to any one of the foregoing embodiments, the multiply-accumulate circuit according to any one of the foregoing embodiments, or the operational circuit according to any one of the foregoing embodiments. For example, such a processor may be a various processor such as a coprocessor, a digital signal processor, a central processor, a dedicated instruction processor, or a neural network processor. In a case in which such a processor is the neural network processor, the convolution calculation unit thereof may include the multiplier according to any one of the foregoing embodiments, the multiply-accumulate circuit according to any one of the foregoing embodiments, or the operational circuit according to any one of the foregoing embodiments.

The present disclosure further provides a computing device in still another aspect, which may include the processor according to any one of the foregoing embodiments. Examples of the computing device may include but are not limited to a consumer electronic product, a component of a consumer electronic product, an electronic test device, and cellular communications infrastructure such as a base station. Examples of the computing device may include but are not limited to a mobile phone such as a smartphone, a wearable computing device such as a smartwatch or a headset, a telephone, a television, a computer monitor, a computer, a modem, a handheld computer, a laptop computer, a tablet computer, a personal digital assistant (PDA), a microwave oven, a refrigerator, an in-vehicle electronic system such as an automotive electronic system, a stereo system, a DVD player, a CD player, a digital music player such as an MP3 player, a radio receiver, a camcorder, a camera such as a digital camera, a portable memory chip, a washing machine, a dryer, a washing machine/dryer, a peripheral device, and a clock. Moreover, the computing device may include an incomplete product.

The terms "left", "right", "front", "rear", "top", "bottom", "above", "under", "upper", "lower", and the like in the specification and the claims, if present, are used for a descriptive purpose and are not necessarily used for describing an unchanged relative position. It is to be understood that the words used in such a way are interchangeable in proper circumstances so that the embodiments of the present disclosure described herein, for example, can be operated in other orientations that are different from those shown herein or those described otherwise. For example, when the device in the accompanying drawings is turned upside down, a feature originally described as being "above" another feature may be described as being "under" another feature in this case. The device may alternatively be oriented in other manners (rotated 90 degrees or in other orientations). In this case, a relative spatial relationship will be interpreted correspondingly.

In the specification and the claims, when an element is referred to as being "above" another element, "attached" to another element, "connected" to another element, "coupled" to another element, "in contact" with another element, or the like, the element may be directly above the another element, directly attached to the another element, directly connected to the another element, directly coupled to the another element, or directly in contact with the another element; or one or more intermediate elements may exist. In contrast, when an element is referred to as being "directly above" another element, "directly attached" to another element, "directly connected" to another element, "directly coupled" to another element, or "in direct contact" with another element, no intermediate element exists. In the specification and the claims, a feature being arranged as being "adjacent" to another feature may mean that the feature has a part that overlaps with the adjacent feature or that is located above or under the adjacent feature.

As used herein, the term "exemplary" means "used as an example, instance, or illustration", and not as a "model" to be accurately copied. Any implementation exemplarily described herein is not necessarily to be construed as preferred or advantageous over other implementations. In addition, the present disclosure is not limited by any stated or implied theory provided in the technical field, background, summary, or detailed description.

As used herein, the term "substantially" means that any minor variation caused by a defect of a design or manufacturing, a tolerance of a device or an element, environmental impact, and/or other factors is included. The term "substantially" also allows for a difference from a perfect or ideal situation caused by parasitic effect, noise, and other practical consideration factors that may exist in practical implementation.

In addition, terms like "first" and "second" may also be used herein for a reference purpose only, and therefore are not intended for a limitation. For example, the terms "first", "second" and other such numerical terms relating to a structure or an element do not imply a sequence or an order unless the context clearly indicates otherwise.

It is to be further understood that the term "comprise/include", when used herein, specifies the presence of stated features, integers, steps, operations, units, and/or components, but do not preclude the presence or addition of one or more other features, integers, steps, operations, units, and/or components, and/or combinations thereof.

In addition, when used in this application, the terms "herein", "foregoing", "following", "hereinafter", and "hereinabove" and terms of similar meanings shall refer to the entirety of this application but not any specific part of this application. Moreover, unless otherwise stated clearly or interpreted in other manners in the context used, conditional language such as "may", "can", "for example", and "such as" used herein are usually intended to indicate that some embodiments include certain features, elements, and/or states but other embodiments do not. Therefore, such conditional language are usually not intended to imply that features, elements, and/or states are required in any manner in one or more embodiments, or imply whether these features, elements, and/or states are included, or imply that these features, elements, and/or states are implemented in any specific embodiment.

In the present disclosure, the term "provide" is used broadly for covering all manners of obtaining an object. Therefore, "providing an object" includes but is not limited to "purchasing", "preparing/manufacturing", "arranging/setting", "installing/assembling", and/or "ordering" the object, etc.

As used herein, the term "and/or" includes any and all combinations of one or more of associated listed items. The terms used herein are merely for the purpose of describing specific embodiments but not intended to limit the present disclosure. The singular forms "a", "an", and "the" as used herein are intended to include plural forms as well, unless otherwise clearly stated in the context.

A person skilled in the art should appreciate that the boundaries between the operations as described above are merely illustrative. A plurality of operations may be combined into a single operation, a single operation may be distributed in an additional operation, and operations may be performed at least partially overlapping in time. In addition, alternative embodiments may include a plurality of instances of a specific operation, and an operation order may be changed in various other embodiments. Other modifications, changes, and replacements, however, are also possible. Aspects and elements of all embodiments disclosed above may be combined in any manner and/or combined with aspects or elements of other embodiments to provide a plurality of additional embodiments. Therefore, the specification and the accompanying drawings are to be regarded as illustrative rather than restrictive. In practice, the novel device, method, and system described herein may be embodied in various other forms. Moreover, various omissions, replacements, and changes may be made to the forms of the method and the system described herein without departing from the spirit of the present disclosure. For example, although blocks are shown in a given arrangement, in alternative embodiments, similar functions with different components and/or circuit topologies may be performed, and some blocks may be removed, moved, added, subdivided, combined, and/or modified. Each of these blocks may be implemented in various different manners.

Each embodiment of the present disclosure may be described in a progressive manner. For same or similar parts between each embodiment, can refer to each other. Descriptions of each embodiment focus on a difference from other embodiments. In the present disclosure, descriptions with reference to the term "an embodiment", "some embodiments", "an example", "a specific example", "some examples", or the like mean that specific features, structures, materials, or characteristics described in conjunction with the embodiment or example are included in at least one embodiment or example of the present disclosure. In the present disclosure, exemplary descriptions of the foregoing terms do not necessarily refer to a same embodiment or example. In addition, the described specific features, structures, materials, or characteristics may be combined in proper manners in any one or more embodiments or examples.

Although some specific embodiments of the present disclosure are described in detail by examples, a person skilled in the art is to understand that the foregoing examples are merely used for description, but not for limiting the scope of the present disclosure. Each embodiment disclosed herein may be combined in any combination without departing from the spirit and scope of the present disclosure. A person skilled in the art is to further understand that various modifications may be made to the embodiments without departing from the scope and spirit of the present disclosure. The scope of the present disclosure is defined by the appended claims.

What is claimed is:

1. A multiplier for performing a multiplication operation of a first multiplicator and a second multiplicator, wherein the first multiplicator is an unsigned number, the second multiplicator is a previously known unsigned or a previously known signed number, and the multiplier comprises:
   a partial product generation circuit, configured to receive the first multiplicator and the second multiplicator and to output a partial product thereof; and
   a partial product summing circuit, wherein an input terminal of the partial product summing circuit is coupled to an output terminal of the partial product generation circuit, and the partial product summing circuit is configured to receive and to sum the partial product output by the partial product generation circuit;
   wherein the partial product generation circuit comprises a first partial product generation circuit for outputting a partial product of a highest bit of the second multiplicator and the first multiplicator, and the first partial product generation circuit is configured to:
   in a case in which the second multiplicator is the previously known unsigned number, output the partial product of the highest bit of the second multiplicator and the first multiplicator; and
   in a case in which the second multiplicator is the previously known signed number, output a negation result of the partial product of the highest bit of the second multiplicator and the first multiplicator.

2. The multiplier according to claim 1, wherein the first partial product generation circuit is configured to:
   receive a sign flag bit indicating whether the second multiplicator is the previously known unsigned or the previously known signed number;
   in a case in which the sign flag bit indicates that the second multiplicator is the previously known unsigned number, output the partial product of the highest bit of the second multiplicator and the first multiplicator; and
   in a case in which the sign flag bit indicates that the second multiplicator is the previously known signed number, output the negation result of the partial product of the highest bit of the second multiplicator and the first multiplicator.

3. The multiplier according to claim 2, wherein the first partial product generation circuit comprises:
   an AND gate group, configured to receive the highest bit of the second multiplicator and the first multiplicator, and to perform an AND operation thereon; and
   an exclusive-OR gate group, configured to receive an AND operation result of the AND gate group and the sign flag bit, and to perform an exclusive-OR operation thereon,
   wherein an exclusive-OR operation result of the exclusive-OR gate group is provided as an output of the first partial product generation circuit.

4. The multiplier according to claim 2, wherein the first partial product generation circuit comprises:
   a NAND gate group, configured to receive the highest bit of the second multiplicator and the first multiplicator, and to perform a NAND operation thereon; and
   an exclusive-OR gate group, configured to receive a NAND operation result of the NAND gate group and the sign flag bit, and to perform an exclusive-OR operation thereon,
   wherein an exclusive-OR operation result of the exclusive-OR gate group is provided as an output of the first partial product generation circuit.

5. The multiplier according to claim 2, wherein the first partial product generation circuit comprises:
   an exclusive-OR gate, configured to receive the highest bit of the second multiplicator and the sign flag bit, and to perform an exclusive-OR operation thereon; and
   a multiplexer group, wherein each multiplexer in the multiplexer group is configured to receive the sign flag bit as a first input, to receive an exclusive-OR operation result of the exclusive-OR gate as a second input, to receive a corresponding bit of the first multiplicator as a selection signal, and to output the first input or the second input according to the selection signal,
   wherein an output of the multiplexer group is provided as an output of the first partial product generation circuit.

6. The multiplier according to claim 2, wherein the first partial product generation circuit comprises:
  an exclusive-OR gate, configured to receive the highest bit of the second multiplicator and the sign flag bit, and to perform an exclusive-OR operation thereon; and
  an inverse multiplexer group, wherein each inverse multiplexer in the inverse multiplexer group is configured to receive the sign flag bit as a first input, to receive an exclusive-OR operation result of the exclusive-OR gate as a second input, to receive a corresponding bit of the first multiplicator as a selection signal, and to output the first input or the second input according to the selection signal,
  wherein an output of the inverse multiplexer group is provided as an output of the first partial product generation circuit.

7. The multiplier according to claim 2, wherein the first partial product generation circuit comprises:
  an AND gate group, configured to receive the highest bit of the second multiplicator and the first multiplicator, and to perform an AND operation thereon; and
  a multiplexer group, configured to receive an AND operation result of the AND gate group as a first input, to receive a negation result of the AND operation result of the AND gate group as a second input, to receive the sign flag bit as a selection signal, and to output the first input or the second input according to the selection signal,
  wherein an output of the multiplexer group is provided as an output of the first partial product generation circuit.

8. The multiplier according to claim 1, wherein the partial product generation circuit further comprises a second partial product generation circuit for outputting a partial product of a modified second multiplicator and the first multiplicator, wherein the modified second multiplicator is obtained by removing the highest bit of the second multiplicator and is an unsigned number, and the second partial product generation circuit comprises a multiplier for performing a multiplication operation of an unsigned number and an unsigned number.

9. The multiplier according to claim 1, wherein the partial product generation circuit further comprises a plurality of second partial product generation circuits, and each of the plurality of second partial product generation circuits is configured to output a partial product of a corresponding bit of the second multiplicator other than the highest bit and the first multiplicator.

10. The multiplier according to claim 9, wherein each of the plurality of second partial product generation circuits comprises one of:
  an AND gate group, configured to receive the corresponding bit of the second multiplicator other than the highest bit and the first multiplicator, and to perform an AND operation thereon, wherein an AND operation result of the AND gate group is provided as an output of the second partial product generation circuit; or
  a NAND gate group, configured to receive the corresponding bit of the second multiplicator other than the highest bit and the first multiplicator, and to perform a NAND operation thereon, wherein a NAND operation result of the NAND gate group is provided as the output of the second partial product generation circuit.

11. The multiplier according to claim 1, wherein an output terminal of the partial product summing circuit is coupled to an input terminal of an additional adding circuit, and the additional adding circuit is configured to add an output of the partial product summing circuit to a constant in a case in which the second multiplicator is the previously known signed number, wherein the constant is $(1-2^z) \cdot 2^{w-1}$, z is a bit width of the first multiplicator, and w is a bit width of the second multiplicator.

12. A multiply-accumulate circuit for performing a multiply-accumulate operation of a plurality of pairs of first numbers and second numbers, wherein the second numbers are previously known, the multiply-accumulate circuit comprises at least one multiply-accumulate circuit, and the multiply-accumulate circuit comprises:
  a multiplication subcircuit comprising a multiplier for performing a multiplication operation of a first multiplicator and a second multiplicator, wherein the first multiplicator is obtained from a first number in a pair of the plurality of pairs of first numbers and second numbers and is an unsigned number, the second multiplicator is obtained from a second number in the pair of the plurality of pairs of first numbers and second numbers and is a previously known unsigned or a previously known signed number, and the multiplier is configured to provide an output as an unsigned number, and the multiplier is the multiplier according to claim 1; and
  an accumulation subcircuit, wherein an input terminal of the accumulation subcircuit is coupled to an output terminal of the multiplication subcircuit, and the accumulation subcircuit is configured to receive and to accumulate an output of the multiplication subcircuit.

13. The multiply-accumulate circuit according to claim 12, wherein the multiplication subcircuit comprises a plurality of multipliers, and each multiplier is configured to receive a corresponding pair of first multiplicator and second multiplicator and to obtain a product of the corresponding pair of first multiplicator and second multiplicator.

14. The multiply-accumulate circuit according to claim 13, wherein the accumulation subcircuit comprises one of:
  n stages of compression trees, a first adder, a second adder, and a register group, wherein an output terminal of the multiplication subcircuit is coupled to a corresponding input terminal of a first-stage of compression tree in the n stages of compression trees, an output terminal of an $i^{th}$-stage of compression tree in the n stages of compression trees is coupled to a corresponding input terminal of an $(i+1)^{th}$-stage of compression tree in the n stages of compression trees, an output terminal of an $n^{th}$-stage of compression tree in the n stages of compression trees is coupled to a corresponding input terminal of the first adder, an output terminal of the first adder is coupled to a corresponding input terminal of the second adder, an output terminal of the second adder is coupled to an input terminal of the register group, and an output terminal of the register group is coupled to a corresponding input terminal of the second adder, wherein n is a positive integer, and i=1, 2, . . . , n−1; or
  n stages of compression trees, a full adder, an adder, and a register group, wherein an output terminal of the multiplication subcircuit is coupled to a corresponding input terminal of a first-stage of compression tree in the n stages of compression trees, an output terminal of an $i^{th}$-stage of compression tree in the n stages of compression trees is coupled to a corresponding input terminal of an $(i+1)^{th}$-stage of compression tree in the n stages of compression trees, an output terminal of an $n^{th}$-stage of compression tree in the n stages of compression trees is coupled to a corresponding input terminal of the full adder, an output terminal of the full adder is coupled to a corresponding input terminal of the adder, an output terminal of the adder is coupled to an input terminal of the register group, and an output terminal of the register group is coupled to a corresponding input terminal of the full adder, wherein n is a positive integer, and i=1, 2, ..., n−1; or n stages of compression trees, an adder, and a register group, wherein an output terminal of the multiplication subcircuit is coupled to a corresponding input terminal of a first-stage of compression tree in the n stages of compression trees, an output terminal of an $i^{th}$-stage of compression tree in the n stages of compression trees is coupled to a corresponding input terminal of an $(i+1)^{th}$-stage of compression tree in the n stages of compression trees, an output terminal of an $n^{th}$-stage of compression tree in the n stages of compression trees is coupled to a corresponding input terminal of the adder, an output terminal of the adder is coupled to an input terminal of the register group, an output terminal of the register group is coupled to a corresponding input terminal of the first-stage of compression tree in the n stages of compression trees, wherein n is a positive integer, and i=1, 2, ..., n−1; or a full adder module with one or more stages of full adders, an adder, and a register group, wherein an output terminal of the multiplication subcircuit is coupled to a corresponding input terminal of the full adder module, an output terminal of the full adder module is coupled to a corresponding input terminal of the adder, an output terminal of the adder is coupled to an input terminal of the register group, and an output terminal of the register group is coupled to a corresponding input terminal of the full adder module.

15. The multiply-accumulate circuit according to claim 12, wherein the at least one multiply-accumulate circuit comprises two or more multiply-accumulate circuits, the multiply-accumulate circuit further comprises a summing circuit, input terminals of the summing circuit are coupled to output terminals of the two or more multiply-accumulate circuits, and the summing circuit is configured to receive and to sum outputs of the two or more multiply-accumulate circuits.

16. The multiply-accumulate circuit according to claim 15, wherein the multiply-accumulate circuit further comprises a control circuit disposed between an output terminal of each of the two or more multiply-accumulate circuits and a corresponding input terminal of the summing circuit, the control circuit is configured to receive a control signal and an output of a corresponding multiply-accumulate circuit, and to control, according to the control signal, whether to provide an output of the corresponding multiply-accumulate circuit to the summing circuit at an output terminal of the control circuit.

17. An operational circuit, comprising:

the multiply-accumulate circuit according to claim 12; and an input processing circuit, wherein an output terminal of the input processing circuit is coupled to an input terminal of the multiply-accumulate circuit, and the input processing circuit is configured to receive the first number and the second number, and to:

in a case in which the first number is a signed number, output the first number as the first multiplicator for feeding into the multiplier by negating a sign bit of the first number, and output the second number as the second multiplicator for feeding into the multiplier;

in a case in which the first number is an unsigned number, output the first number as the first multiplicator for feeding into the multiplier, and output the second number as the second multiplicator for feeding into the multiplier.

18. An operational circuit, comprising:

the multiplier according to claim 1; and an additional adding circuit, wherein an output terminal of the multiplier is coupled to an input terminal of the additional adding circuit, and the additional adding circuit is configured to add an output of the partial product summing circuit and a constant in a case in which the second multiplicator is a signed number, wherein the constant is $(1-2^z) \cdot 2^{w-1}$, z is a bit width of the first multiplicator, and w is a bit width of the second multiplicator.

19. A processor, comprising the multiplier according to claim 1.

20. A calculation apparatus, comprising the processor according to claim 19.

* * * * *